(12) United States Patent
Tadayon et al.

(10) Patent No.: US 10,488,438 B2
(45) Date of Patent: Nov. 26, 2019

(54) HIGH DENSITY AND FINE PITCH INTERCONNECT STRUCTURES IN AN ELECTRIC TEST APPARATUS

(71) Applicant: Intel Corporation, Santa Clara, CA (US)

(72) Inventors: Pooya Tadayon, Portland, OR (US); Mark Bohr, Aloha, OR (US); Joe Walczyk, Tigard, OR (US)

(73) Assignee: Intel Corporation, Santa Clara, CA (US)

( * ) Notice: Subject to any disclaimer, the term of this patent is extended or adjusted under 35 U.S.C. 154(b) by 115 days.

(21) Appl. No.: 15/863,600

(22) Filed: Jan. 5, 2018

(65) Prior Publication Data

US 2019/0212366 A1 Jul. 11, 2019

(51) Int. Cl.
| | | |
|---|---|---|
| G01R 1/073 | (2006.01) |
| H01L 23/48 | (2006.01) |
| H01L 23/32 | (2006.01) |
| H01L 21/48 | (2006.01) |
| H01L 21/027 | (2006.01) |
| G01R 31/28 | (2006.01) |
| H01L 23/14 | (2006.01) |

(52) U.S. Cl.
CPC ..... *G01R 1/07342* (2013.01); *G01R 1/07378* (2013.01); *G01R 31/2886* (2013.01); *H01L 21/0273* (2013.01); *H01L 21/486* (2013.01); *H01L 23/147* (2013.01); *H01L 23/32* (2013.01); *H01L 23/481* (2013.01)

(58) Field of Classification Search
CPC ............ G01R 1/07342; G01R 31/2886; G01R 1/07378; H01L 23/147; H01L 21/0273; H01L 23/32; H01L 23/481; H01L 21/486
USPC ................................ 324/755.07, 755.01, 537
See application file for complete search history.

(56) References Cited

U.S. PATENT DOCUMENTS

| | | | | |
|---|---|---|---|---|
| 5,592,222 A | * | 1/1997 | Nakamura ............. | G11C 19/00 257/225 |
| 2005/0231855 A1 | * | 10/2005 | Tran ........................ | H01L 45/16 360/324.1 |
| 2010/0276572 A1 | * | 11/2010 | Iwabuchi .............. | H01L 23/481 250/208.1 |

* cited by examiner

*Primary Examiner* — Giovanni Astacio-Oquendo
(74) *Attorney, Agent, or Firm* — Green, Howard & Mughal LLP.

(57) ABSTRACT

An electrical-test apparatus is provided, which includes a MEMS array. In an example, the MEMS array comprises a plurality of tester interconnect structures cantilevered from first terminals on a first side of a substrate. The tester interconnect structures may have a first diameter. In an example, the MEMS array comprises a plurality of through-substrate vias that extend through the substrate, the vias having a second diameter larger than the first diameter. In an example, individual ones of the vias electrically couple individual ones of the tester interconnect structures to corresponding ones of second terminals on a second side of the substrate.

20 Claims, 32 Drawing Sheets

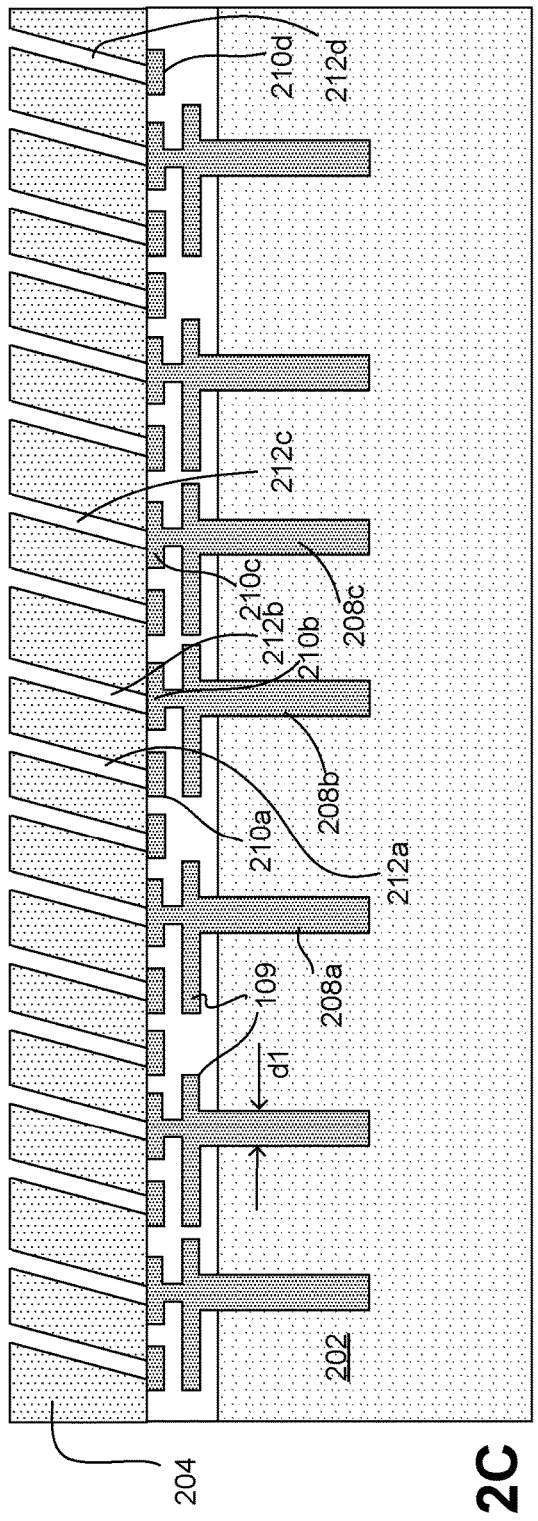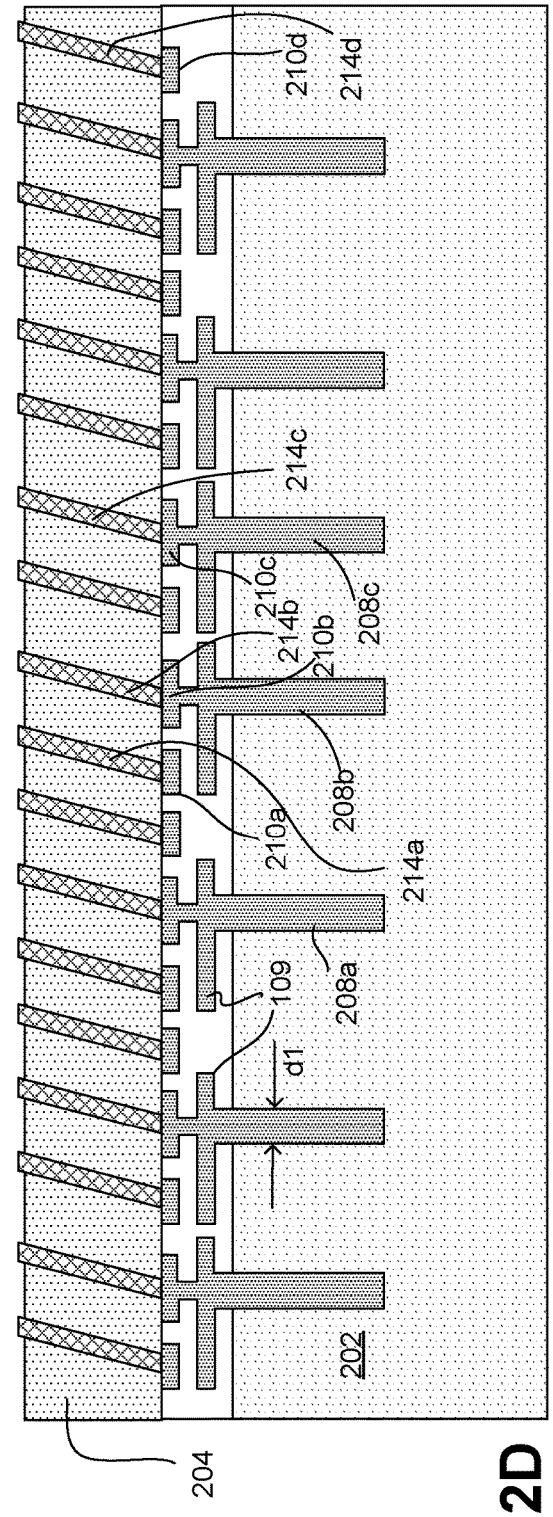
Fig. 2C
Fig. 2D

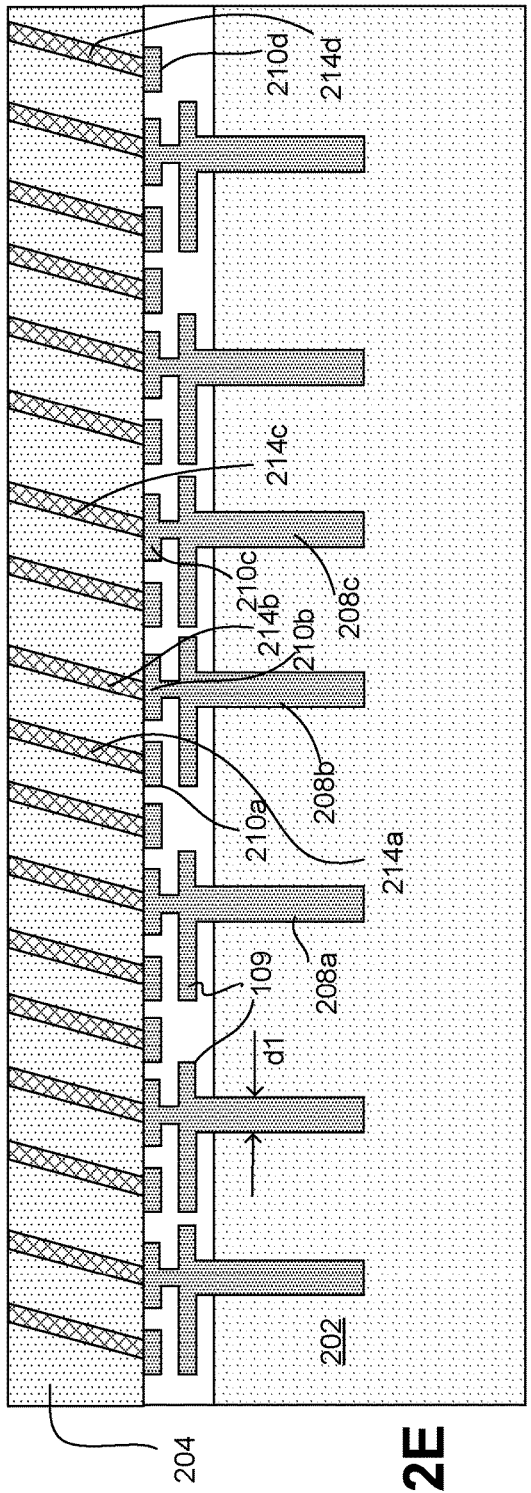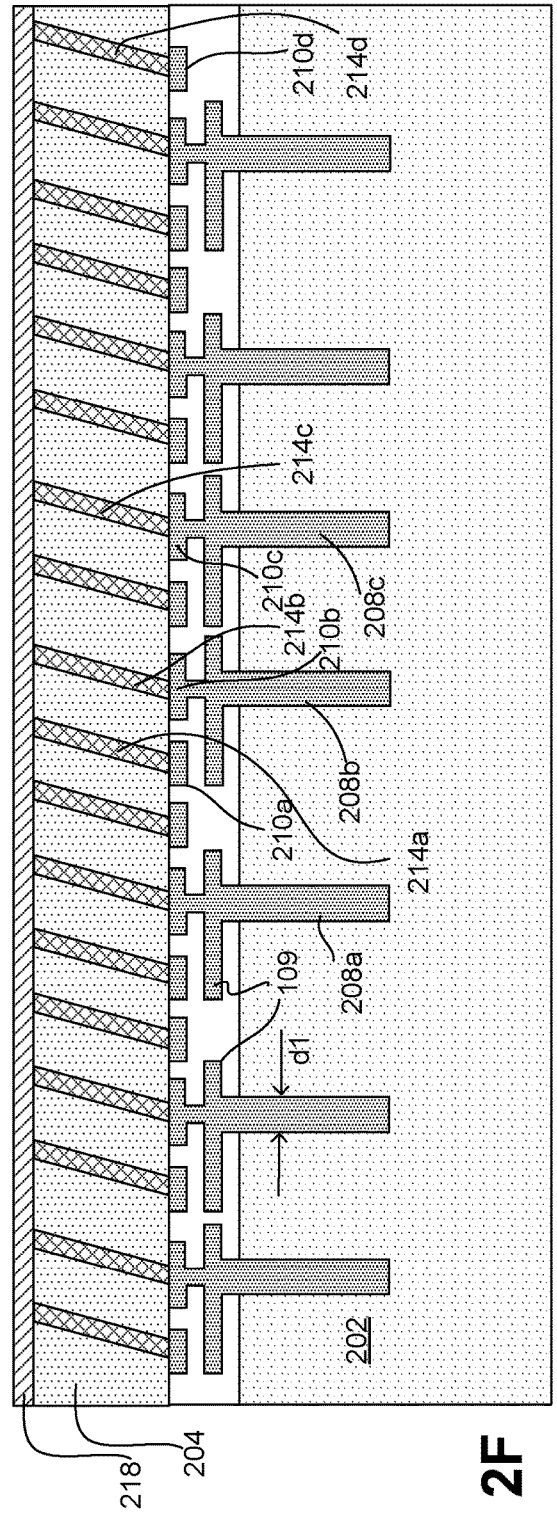

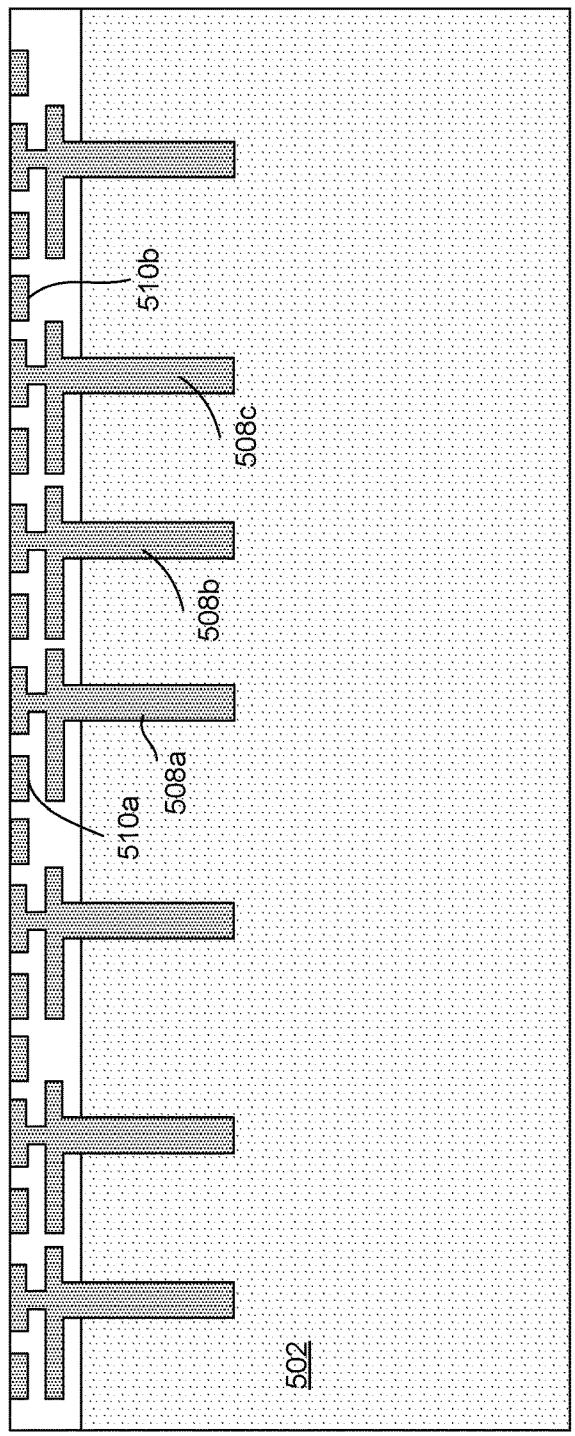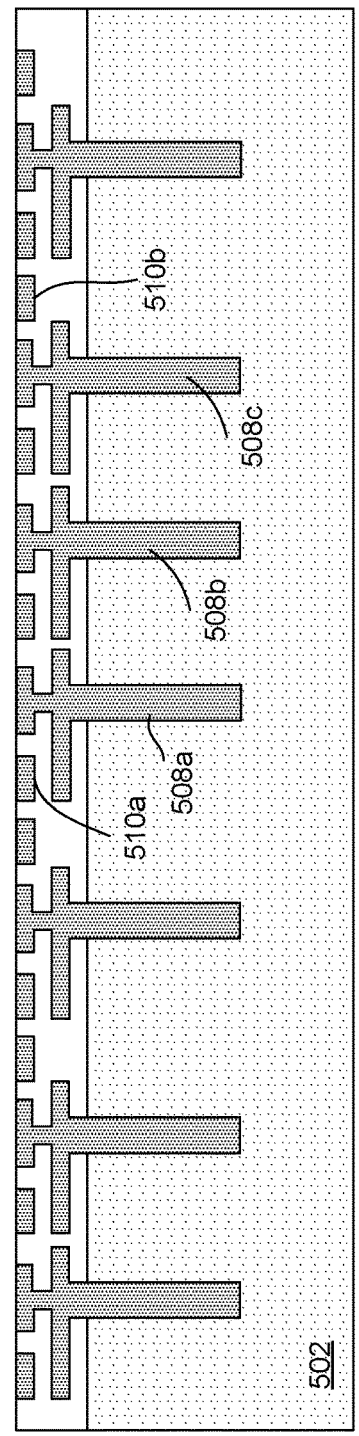
Fig. 5A
Fig. 5B

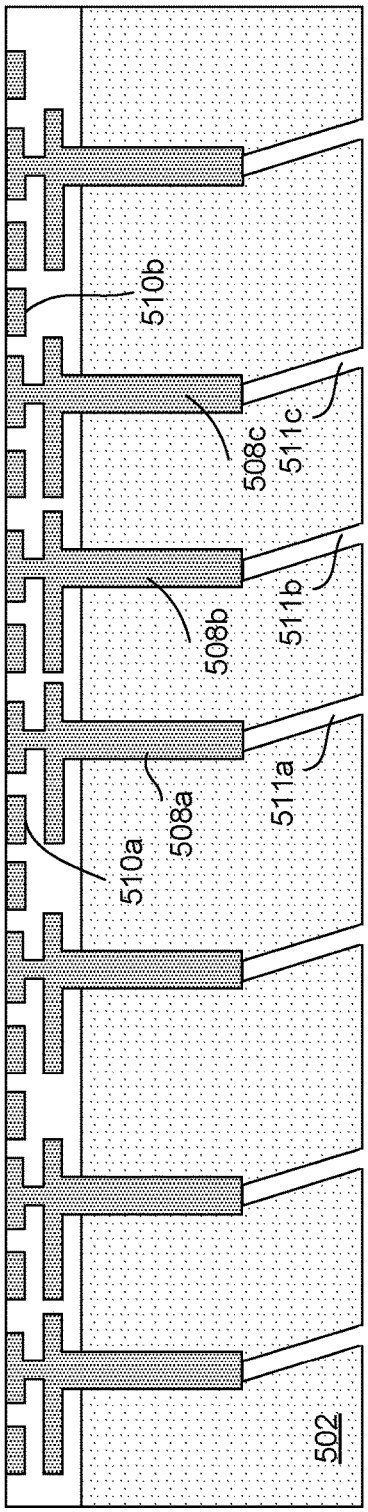
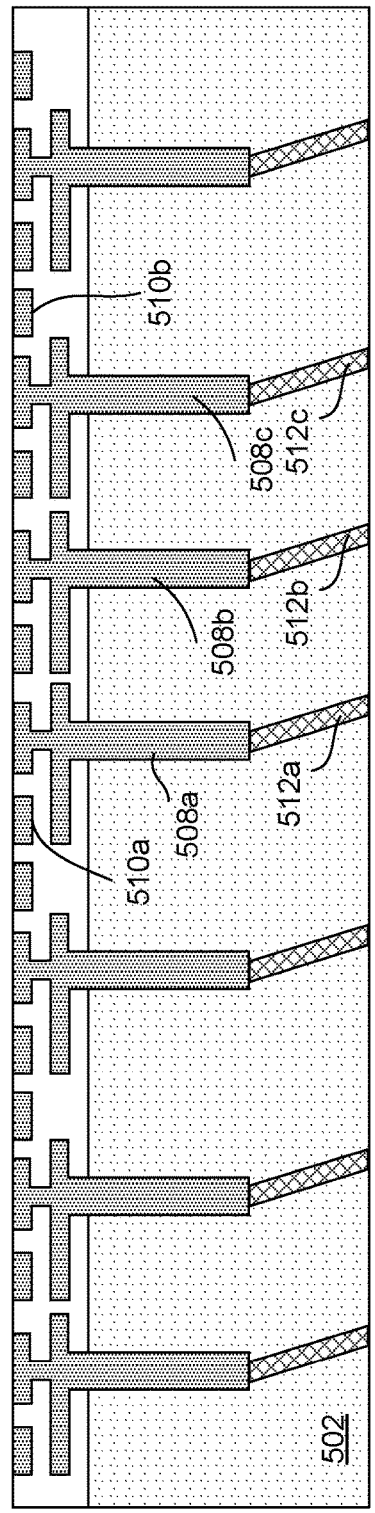
Fig. 5C
Fig. 5D

HIGH DENSITY AND FINE PITCH INTERCONNECT STRUCTURES IN AN ELECTRIC TEST APPARATUS

BACKGROUND

Tester interconnect solutions (e.g., test probes, test contacts, etc.) are a fundamental requirement for testing semiconductor devices at wafer or package level. These interconnects usually have to be compressible, provide adequate amount of force to achieve stable and repeatable electrical contact, and be able to repeat testing over several hundred thousand to millions of cycles. As semiconductor bump or pad pitch decreases at the wafer and package level and as a number of interconnects increases, the challenge of manufacturing such interconnects with existing technology may become prohibitive. For example, usually, interconnects used in test manufacturing are built using a serial one-interconnect-at-a-time approach, where the interconnects are assembled on a substrate one at a time, which may result in increased time and cost to manufacture, and decreased accuracy.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIGS. 2A, 2B, 2C, 2D, 2E, 2F, 2G, 2H, 2I, 2J, and 2K illustrate example processes for formation of the apparatus of FIGS. 1A-1B, according to some embodiments.

FIGS. 5A, 5B, 5C, 5D, 5E, and 5F illustrate example processes for formation of the apparatus of FIG. 1F, according to some embodiments.

DETAILED DESCRIPTION

Figure 1A:
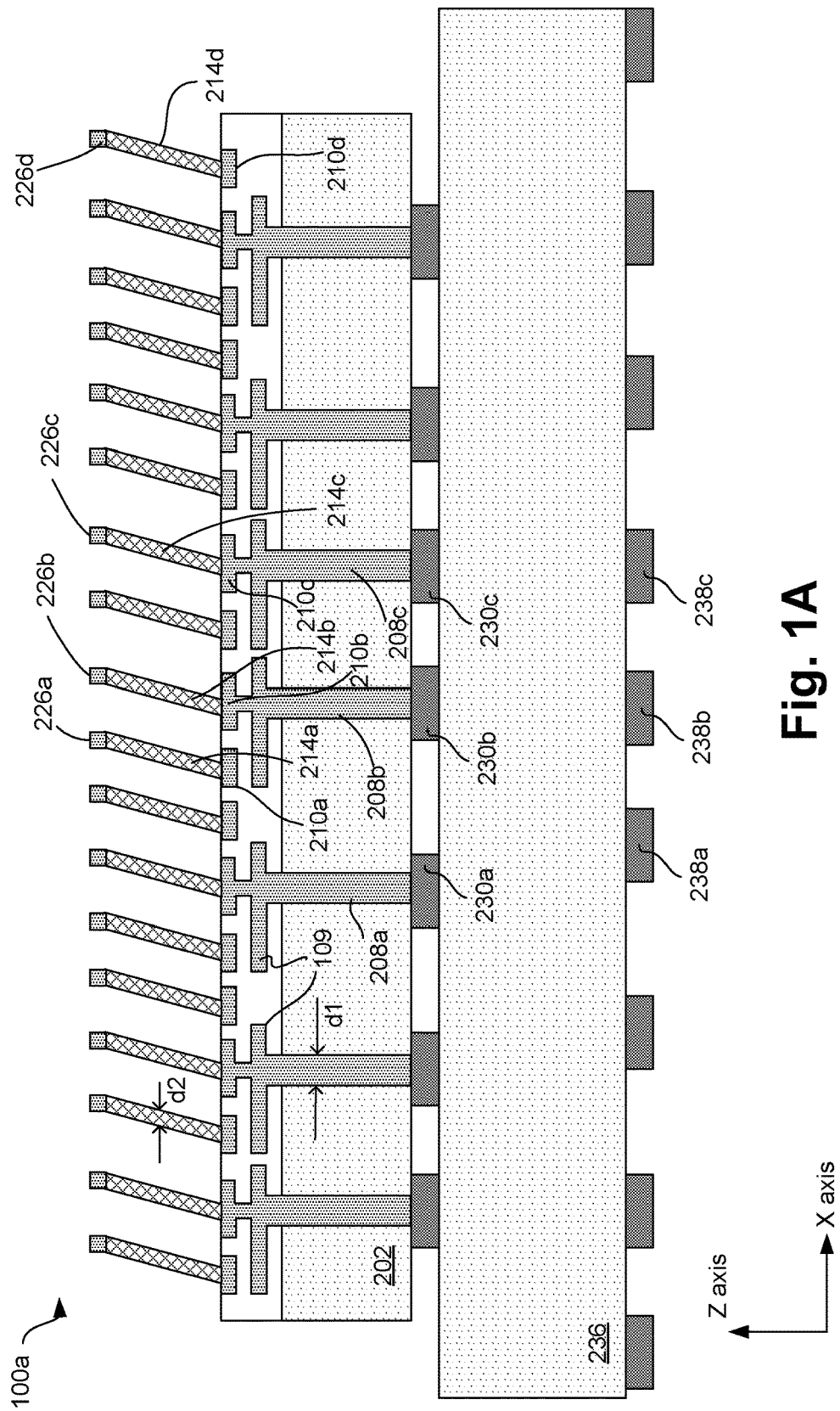
FIG. 1A illustrates a cross sectional view of an electrical-test probing apparatus including a plurality of tester interconnect structures that are arranged from a plane of a substrate, according to some embodiments.

Modern electrical test apparatus may include hundreds, thousands, or even hundreds of thousands of tester interconnect structures (e.g., test probes or test contacts). The pitch of the test probes is becoming increasing smaller. Using a one-at-a-time approach to assemble or attach such a large number of test probes with a very fine pitch to a substrate becomes a challenge, e.g., in terms of cost, time required for the assembly process, and accuracy or quality of the assembly process.

Various embodiments of this disclosure disclose three-dimensional batch fabrication processes to form test probes. For example, multiple test probes (e.g., hundreds, thousands, or even tens or hundreds of thousands) may be formed on a substrate substantially at the same time.

In an example, because all the test probes are manufactured in parallel, the manufacturing time may be reduced compared to a one-at-a-time approach to assemble the test probes. For example, it would take the same amount of time to produce a solution with 1 test probe or hundreds of thousands test probes. Thus, the cost curve or the time curve may no longer scale with the number of test probes. In addition, lithography based processes to form the test probes, as discussed herein, may reduce probe to probe variations, even at relatively small pitch. Other technical effects will be evident from the various embodiments and figures.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on." The terms "substantially," "close," "approximately," "near," and "about," generally refer to being within +/−10% of a target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C). The terms "left," "right," "front," "back," "top," "bottom," "over," "under," and the like in the description and in the claims, if any, are used for descriptive purposes and not necessarily for describing permanent relative positions.

FIG. 1A illustrates a cross sectional view of an electrical-test probing apparatus 100a (henceforth also referred to as apparatus 100a) including a plurality of tester interconnect structures 214 that are arranged from a plane of a substrate 202, according to some embodiments. In some embodiments, the apparatus 100a includes the tester interconnect structures 214a, 214b, 214c, 214d, etc. (merely four of the tester interconnect structures are labeled in FIG. 1A). The tester interconnect structures 214a, 214b, 214c, 214d are also referred to herein as test probes 214a, 214b, 214c, 214d, or simply as probes 214a, 214b, 214c, 214d.

Elements referred to herein with a common reference label followed by a particular number or alphabet may be collectively referred to by the reference label alone. For example, probes 214a, 214b, 214c, 214d may be collectively and generally referred to as probes 214 in plural, and probe 214 in singular.

In some embodiments, the apparatus 100a includes a plurality of terminals 210a, 210b, 210c, 210d, etc. (merely four terminals are labeled in FIG. 1A) of a top side of a substrate 202. A probe 214 is attached to or anchored to a corresponding terminal 210. For example, the probe 214a is attached to a terminal 210a, the probe 214b is attached to a terminal 210b, and so on. Thus, the probes 214 are cantilevered from the corresponding terminals 210.

Merely as an example, there may be 5,000 or more probes 214 in the apparatus 100a. In another example, there may be tens of thousands, or even hundreds of thousands of probes 214 in the apparatus 100a. Merely as an example, a probe 214 may protrude by at least 100 µm from a corresponding anchor point on the substrate 202 (e.g., from a corresponding terminal 210). The probes 214 may extend from the corresponding terminals 210 in substantially the same direction, e.g., which may be normal or non-normal from a plane of the substrate 202. For example, FIG. 1A illustrates the probes 214 extending in a non-normal direction from the plane of the substrate 202. In some other examples (and although not illustrated in FIG. 1A), the probes 214 may extend in a substantially normal direction from the plane of the substrate 202

In some embodiments, a probe 214 has one end attached to a corresponding terminal 210, and another end (e.g., a free end) that has a contact tip 226 formed thereon. For example, the probe 214a has a contact tip 226a formed on a free end of the probe 214a, the probe 214b has a contact tip 226b formed on a free end of the probe 214b, and so on. In some embodiments, the probes 214, including the contact tips 226, comprise conductive material (e.g., nickel, copper, silver, an appropriate metal, and/or an appropriate conductive material).

The terminals 210 may be formed on the substrate 202. In some embodiments, the substrate 202 is a crystal that includes silicon. In some embodiments, the substrate 202 is a semiconductor wafer.

In some embodiments, a terminal 210 is coupled to a through substrate via 208. For example, the terminal 210b is coupled to a via 208b, the terminal 210c is coupled to a via 208c, and so on. Not all vias are illustrated in the cross-sectional view of FIG. 1 (e.g., vias coupled to the terminals 210a and 210d are not illustrated in FIG. 1A).

The vias 208 may include conductive material (e.g., an appropriate metal), and may extend through the substrate 202. In some embodiments, the terminals 210 are coupled to the corresponding vias 208 through one or more interconnect levels 109. The interconnect levels 109 include, for example, traces, routing structures, redistribution layers, etc. The interconnect levels 109 include conductive material, such as copper, nickel, etc.

In some embodiments, a diameter of the probes 214 is less than a diameter of the vias 208. For example, as illustrated in FIG. 1A, individual probes 214 have a cross-sectional length (e.g., a diameter) of d2, and individual vias 208 have a cross-sectional length (e.g., a diameter) of d1, where d1 may be more than d2 (although in some other examples, d2 may be similar to, or more than d1).

In some examples, a cross-sectional length (e.g., a diameter) of the probes 214 and/or the terminals 210 may be in the range on about 10-30 µm, e.g., depending on a pitch of the terminals 210 and/or a pitch of the probes 214. In an example, the diameter of the terminals 210 may be at least as large as (or larger than) the diameter d2 of the probes 214.

Various examples of this disclosure discuss diameters of the probes 214, terminals 210, vias 208, etc. Such examples assume a somewhat circular cross-section of the probes 214, terminals 210, vias 208, etc. However, in some examples, one or more of the probes 214, terminals 210, or vias 208 may have a cross-section that is not circular, e.g., may have an oval cross section, a rectangular cross section, a square cross section, a triangular cross section, or another appropriate cross-sectional shape. In such examples, the diameter of these components may refer to a cross sectional length.

In some embodiments, a pitch of the probes 214 may be higher than a pitch of the vias 208. Merely as an example, a pitch of the probes 214 may be as small as or even smaller.

The terminals 214 may be on a first side of the substrate 202. In some embodiments, terminals 230 are on a second side of the substrate 202, the second side being opposite the first side (in FIG. 1A, merely three example terminals 230a, 230b, and 230c are labeled). A via 208 may couple a corresponding terminal 214 to a corresponding terminal 230. For example, a via 208b may couple the terminal 210b to the terminal 230b, a via 208c may couple the terminal 210c to the terminal 230c, and so on.

In some embodiments, the substrate 202 is coupled to a space transformer 236 through the terminals 230. For example, the terminals 230 are on a first side of the space transformer 236. In some embodiments, the space transformer 236 includes terminals 238 on a second side of the space transformer 236.

In some embodiments, the space transformer 236 include interconnection levels, redistribution layers, traces, vias, and/or other form of interconnect structures (not illustrated in FIG. 1A) that couple a terminal 230 to a corresponding terminal 236. In some embodiments, a pitch of the terminals 238 may be higher than a pitch of the terminals 230 and the vias 208, and may be higher than the pitch of the terminals 210 and the probes 214. The space transformer 236 may act as an interposer between the terminals 230 and 238, and translate the lower pitch of the terminals 230 to the higher pitch of the terminals 238.

In some embodiments, the space transformer 236 is an organic package, a ceramic, or any other appropriate component that provides a rigid structure and has internal routing to translate the lower pitch of the terminals 230 to the higher pitch of the terminals 238. Although not illustrated in FIG. 1A, testing arrangements, such as a test card, may be coupled to the terminals 238 of the space transformer 236.

Figure 1B:
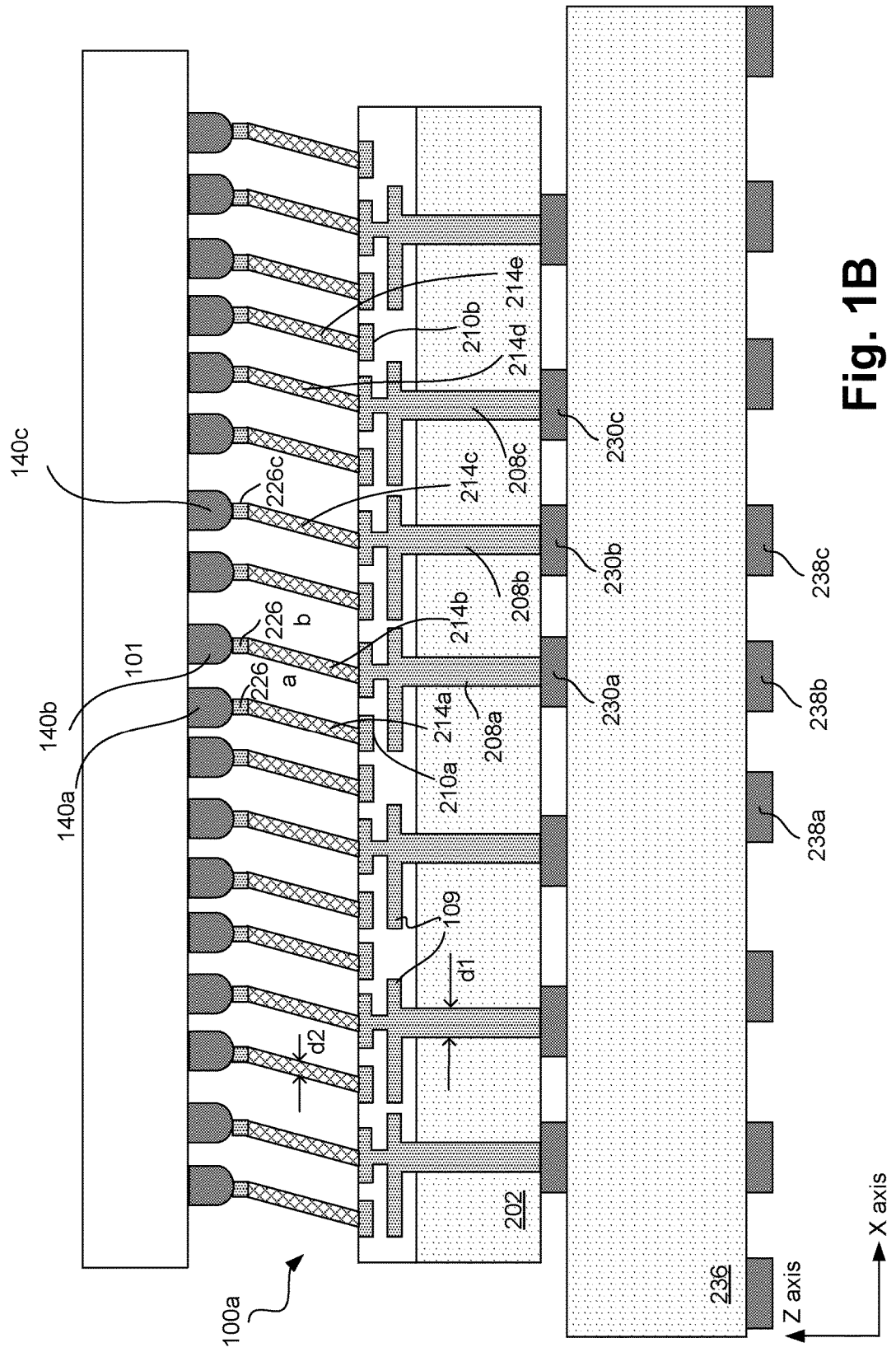
FIG. 1B illustrates the apparatus of FIG. 1A being coupled to a device under test (DUT), according to some embodiments.

FIG. 1B illustrates the apparatus 100a of FIG. 1A being coupled to a device under test (DUT) 101, according to some embodiments. The DUT 101 may be any appropriate integrated circuit (IC) device, an IC package, a IC die or chip, a bar IC die, a wafer, a packaged IC die, and/or another appropriate component. The DUT 101 includes a plurality of interconnect structures 140 (e.g., interconnect structures 140a, 140b, 140c). For example, a probe 214 of the apparatus 100a (e.g., a corresponding contact tip 226 of the probe 216) may be in contact with (e.g., compressed against) a corresponding interconnect structure 140 of the DUT 101, e.g., when the DUT 101 is being probed or tested by the apparatus 100a. For example, when the DUT 101 is to be tested and/or probed by the apparatus 100a, current flows through the probes 214 to the interconnect structures 140 of the DUT 101. A testing arrangement coupled to the terminals 238 of the space transformer 236 monitors the current, and facilitates in probing and/or testing the DUT 101.

In FIGS. 1A-1B, a probe 214 may include a single member anchored to the substrate 202 at a first end, with a contact tip 226 at a second or free end of the member. However, it may be possible to have a probe with two or more segments or members. For example, FIG. 1C illustrates a cross sectional view of an electrical-test probing apparatus 100b (henceforth also referred to as apparatus 100b) including a plurality of tester interconnect structures 314 (also referred to as probes 314) that are arranged in a non-normal direction from a plane of a substrate 302, wherein individual tester interconnect structure 314 may include at least two segments or members, according to some embodiments.

The apparatus 100b is at least in part similar to the apparatus 100a of FIGS. 1A-1B, and any discussion with respect to the apparatus 100a may be at least in part applicable to the apparatus 100b (e.g., unless such discussion is contrary to the structure of the apparatus 100b). However, unlike the probes 214 of the apparatus 100a, a probe 314 of the apparatus 100b includes two distinct segments.

Figure 1C:
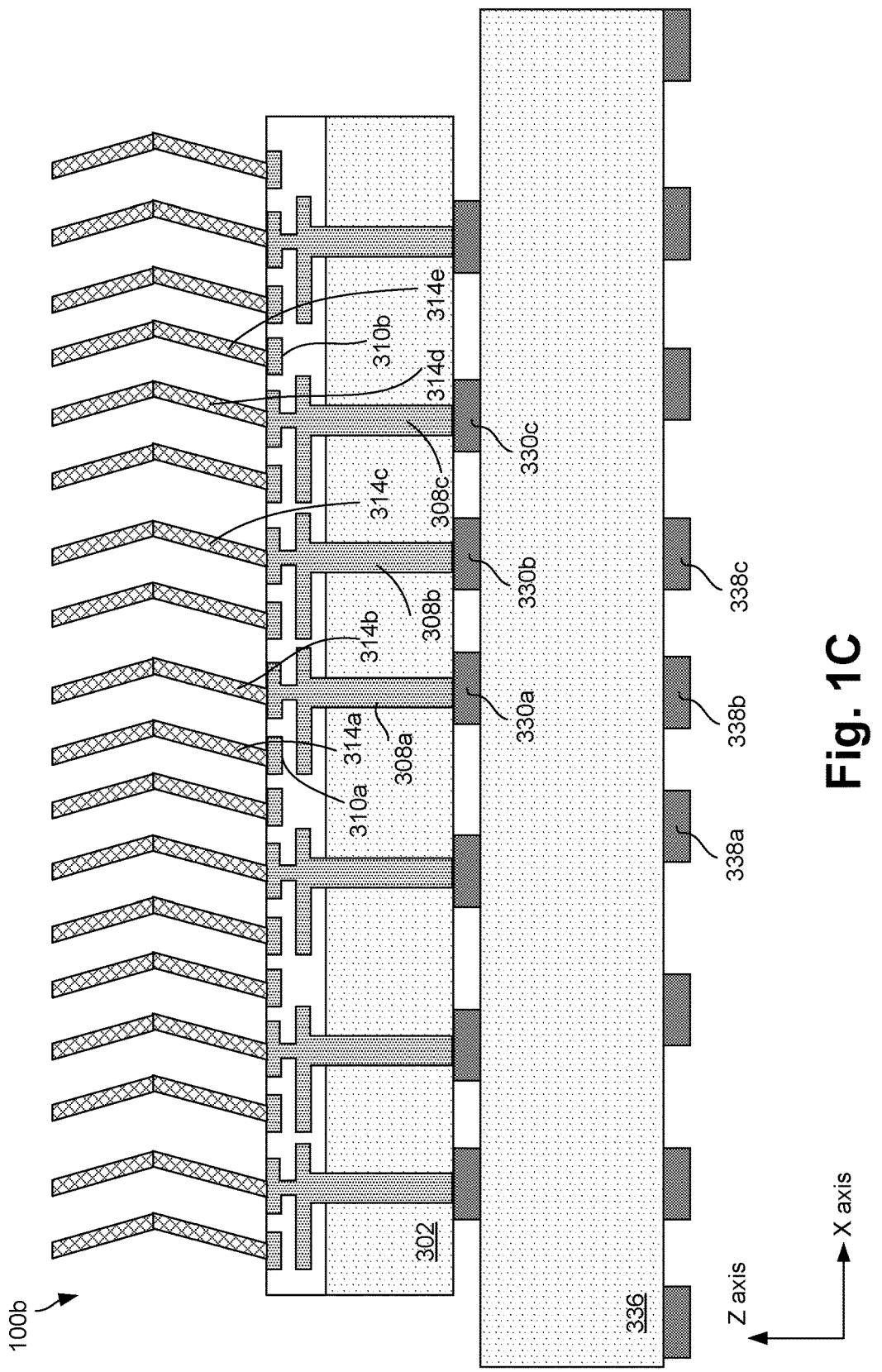
FIG. 1C illustrates a cross sectional view of an electrical-test probing apparatus including a plurality of tester interconnect structures that are arranged in a non-normal direction from a plane of a substrate, wherein individual tester interconnect structure may include at least two segments or members, according to some embodiments.
Figure 1D:
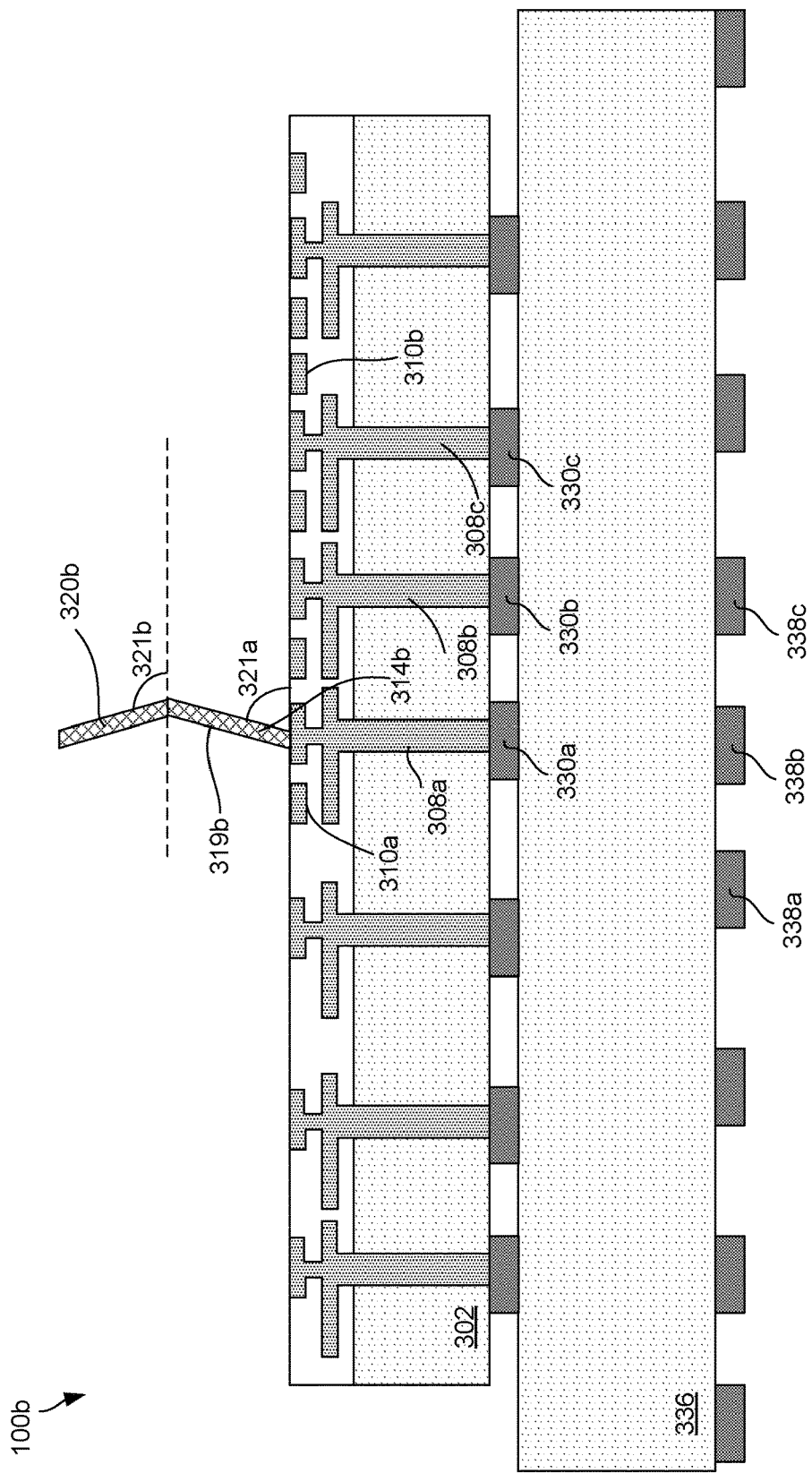
FIG. 1D illustrates the tester interconnect structure of the apparatus of FIG. 1C in further details, according to some embodiments.

FIG. 1D illustrates the tester interconnect structure 314 of the apparatus 100b of FIG. 1C in further details, according to some embodiments. Only a single probe 314b is illustrated in FIG. 1D, without illustrating the remaining probes 314a, 314c, etc. As illustrated in FIGS. 1C-1D, the probe 314b has two segments 319b and 320b, with a bend between the two segments. For example, the segment 319b is at an angle 321a with respect to a plane of the substrate 302, and the segment 320b is at an angle 321b with respect to the plane of the substrate 302. In the example of FIGS. 1C-1D, the angle 321a is an acute angle, and the angle 321b is an obtuse angle. Thus, the bend in the probe 314b takes the free end of the probe 314b towards the anchor point (e.g., a point at which the probe 314b is coupled to a corresponding terminal 310) of the probe 314b. In an example, an angle between the two members 319b and 320b is less than 180 degrees.

In some embodiments, the apparatus 100b includes the terminals 310, 330, 338, the vias 308, the space transformer 336, etc. These components are at least in part similar to the corresponding components of the apparatus 100a of FIGS. 1A-1B—hence, these components are not discussed in further detail herein.

In some embodiments, the free end of the probes 314 have corresponding contact tips (e.g., similar to the contact tips 226 of FIG. 1A-1B), although such contact tips are not illustrated in FIGS. 1C-1D. In an example, the free end of the probes 314 may contact the interconnect structure of a DUT, e.g., similar to the DUT 101 of FIG. 1B. Although the probes 314 of FIGS. 1C-1D has two segments, probes with more than two segments or having other complex structures (e.g., three segments, four segments, etc.) may also be possible.

Figure 1E:
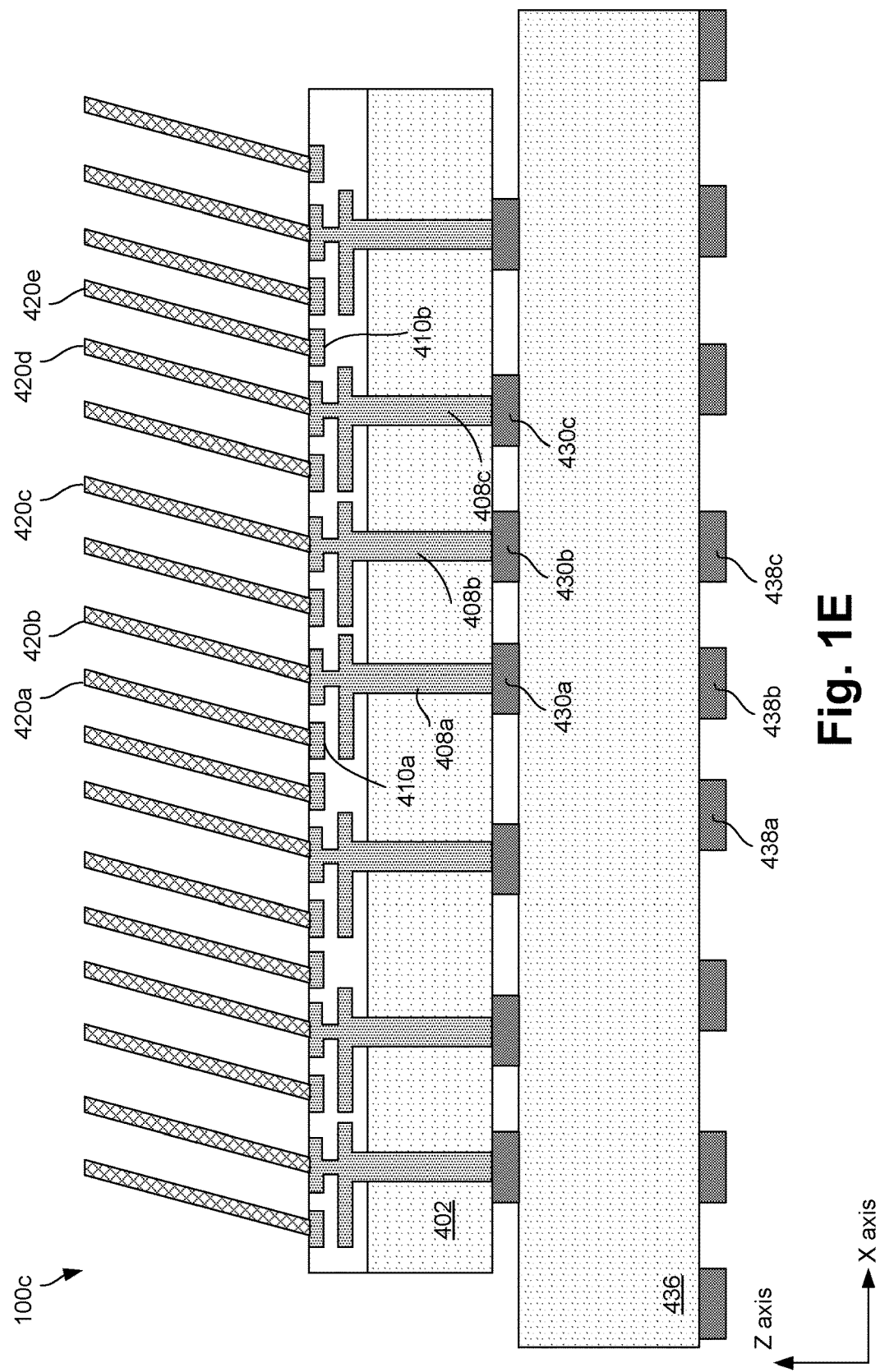
FIG. 1E illustrates a cross sectional view of an electrical-test probing apparatus including a plurality of high aspect ratio tester interconnect structures that are arranged in a non-normal direction from a plane of a substrate, according to some embodiments.

FIG. 1E illustrates a cross sectional view of an electrical-test probing apparatus 100c (henceforth also referred to as apparatus 100c) including a plurality of high aspect ratio tester interconnect structures 420 (also referred to as probes 420) that are arranged in a non-normal direction from a plane of a substrate 402, according to some embodiments. In some embodiments, a length of individual probes 420 of the apparatus 100c may be relatively higher than a length of individual probes 214 of the apparatus 100a. Thus, for example, the probes 420 may have higher aspect ratio than that of the probes 214.

In some embodiments, the apparatus 100c includes the terminals 410, 430, 438, vias 408, space transformer 436, substrate 402, etc. These components are at least in part similar to the corresponding components of the apparatus 100a of FIGS. 1A-1B—hence, these components are not discussed in further detail herein. Any discussion with respect to the apparatus 100a may be at least in part applicable to the apparatus 100c (e.g., unless such discussion is contrary to the structure of the apparatus 100c).

Figure 1F:
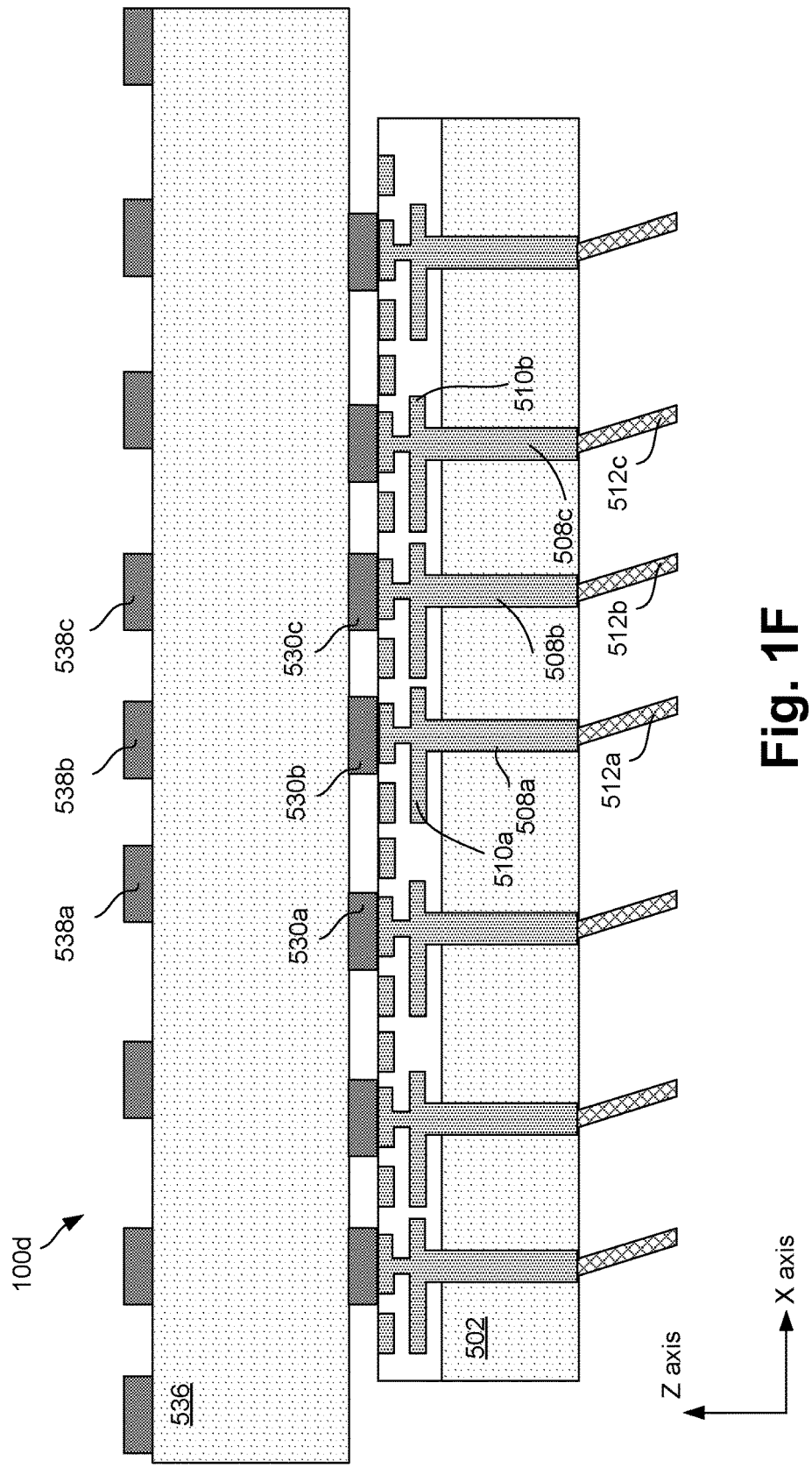
FIG. 1F illustrates a cross sectional view of an electrical-test probing apparatus including a plurality of tester interconnect structures that are anchored from a corresponding plurality of through substrate vias and arranged in a non-normal direction from a plane of a substrate, according to some embodiments.

FIG. 1F illustrates a cross sectional view of an electrical-test probing apparatus 100d (henceforth also referred to as apparatus 100d) including a plurality of tester interconnect structures 512 (also referred to as probes 512) that are anchored from a corresponding plurality of through substrate vias 508 and arranged in a non-normal direction from a plane of a substrate 502, according to some embodiments. Contrary to the apparatus 100a of FIGS. 1A-1B, in the apparatus 100d of FIG. 1F, the probes 512 are attached to the vias 508.

In some embodiments, the apparatus 100d further includes terminals 510, 530, 538, and the space transformer 536. These components are at least in part similar to the corresponding components of the apparatus 100a of FIGS. 1A-1B—hence, these components are not discussed in further detail herein. Any discussion with respect to the apparatus 100a may be at least in part applicable to the apparatus 100d (e.g., unless such discussion is contrary to the structure of the apparatus 100d).

Figure 1G:
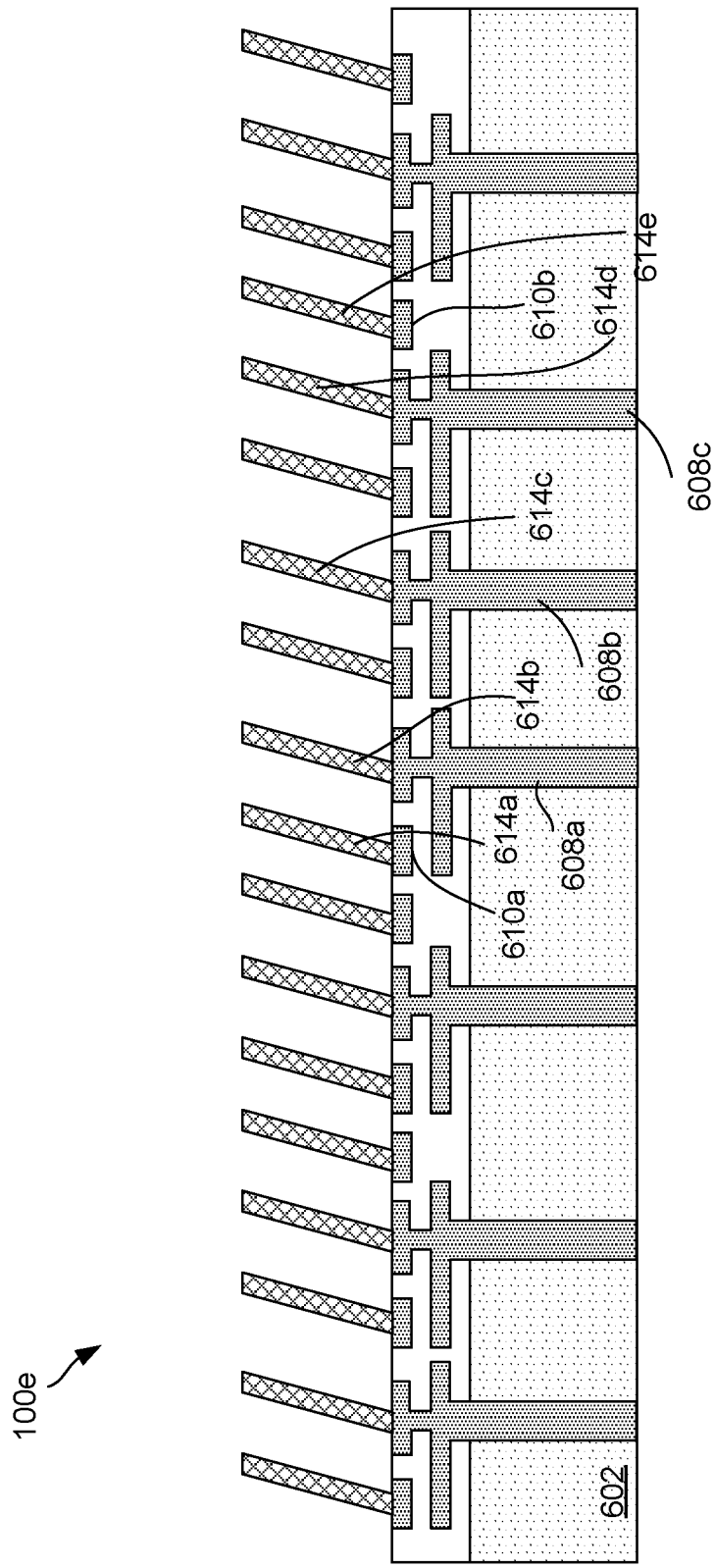
FIG. 1G illustrates a cross sectional view of an electrical-test probing apparatus including a plurality of tester interconnect structures, wherein individual ones of the tester interconnect structures have a single segment arranged in a non-normal direction from a plane of a substrate, according to some embodiments.

FIG. 1G illustrates a cross sectional view of an electrical-test probing apparatus 100e (henceforth also referred to as apparatus 100e) including a plurality of tester interconnect structures 614 (also referred to as probes 614), wherein individual ones of the tester interconnect structures have a single segment arranged in a non-normal direction from a plane of a substrate 602, according to some embodiments. The apparatus 100e is substantially similar to the apparatus 100a of FIG. 1A. However, unlike FIG. 1A, the apparatus 100e may not include a contact tip on a free end of the probes 614. Furthermore, although not illustrated in FIG. 1G, the apparatus 100e may be attached to a space transformer, e.g., similar to FIG. 1A. Any discussion with respect to the apparatus 100a may be at least in part applicable to the apparatus 100e (e.g., unless such discussion is contrary to the structure of the apparatus 100e).

FIGS. 2A-2K illustrate example processes for formation of the apparatus 100a of FIGS. 1A-1B, according to some embodiments. For example, FIGS. 2A-2K are cross-sectional views of the apparatus 100a evolving as example operations for formation of the apparatus 100a are performed.

Figure 2A:
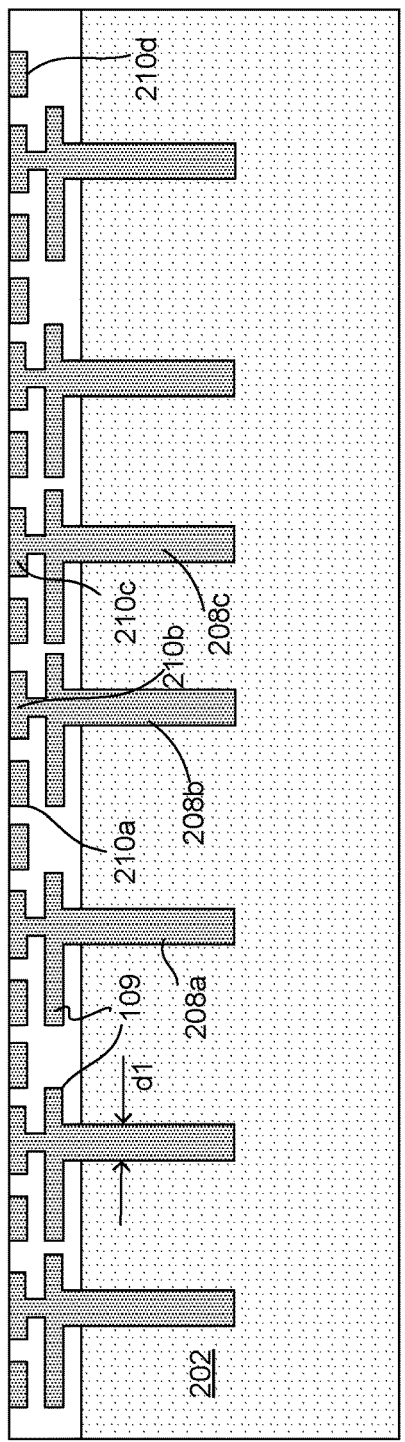

Referring to FIG. 2A, vias 208 may be formed through the substrate 202, and the terminals 210 may be formed to be coupled to the corresponding vias 208. Interconnect levels 109 may couple the terminals 210 to the vias 208, e.g., as discussed with respect to FIG. 1A. In some examples, the vias 208 may be at a lower pitch than the terminals 210 (although in some other examples, the vias 208 may be at a higher pitch than the terminals 210).

Figure 2B:
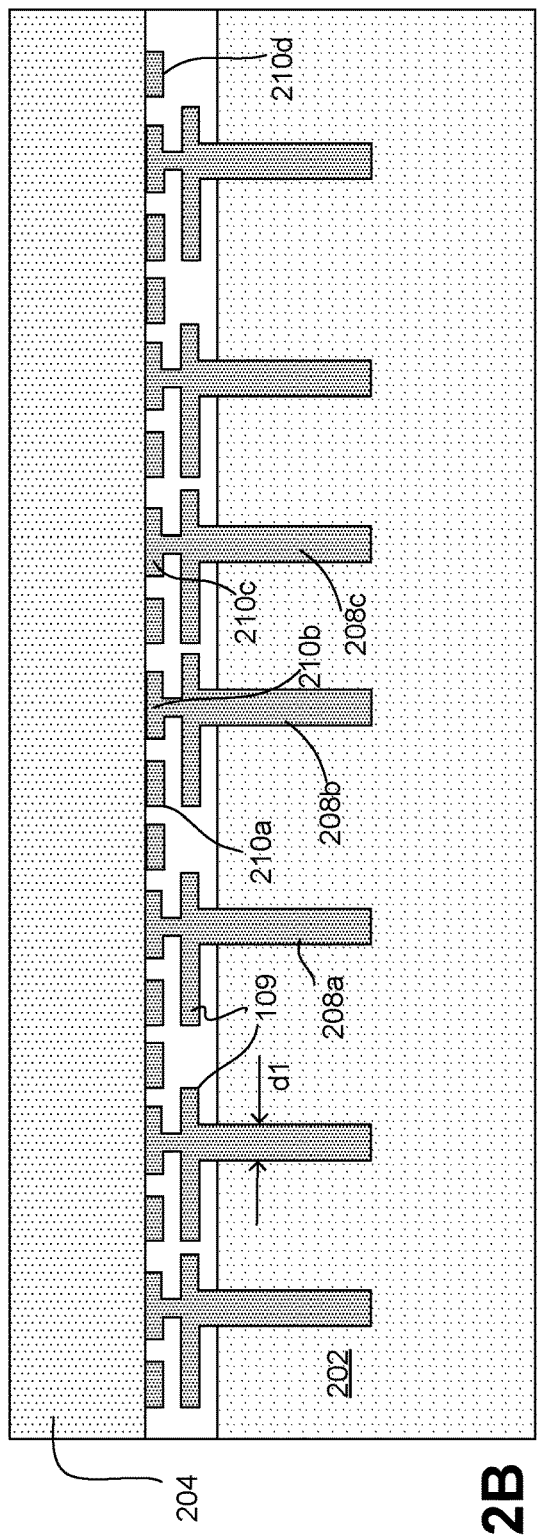

Referring to FIG. 2B, a layer 240 of photoresist material may be applied on the substrate 202. A thickness of the layer 204 may range from 100 μm to several hundred microns. The photoresist of the layer 104 may be a positive photoresist or a negative photoresist. Although not illustrated in FIG. 2B, in some embodiments, a metal seed layer is deposited on the terminals 210 (e.g., a top surface of the terminals 210), e.g., to aid in downstream processing. In some other embodiments, such a metal seed layer is not deposited.

Referring to FIG. 2C, in some embodiments, openings 212a, 212b, 212c, etc. may be formed through the layer 204 of photoresist material. An opening 212 may be formed over a corresponding terminal 210. For example, opening 212a may be formed over the terminal 210a, opening 212b may be formed over the terminal 210b, and so on. In some embodiments, the openings 212 may be angled (e.g., non-normal) with respect to the plane of the substrate 202, while in other embodiments the openings 212 may be substantially normal to the plane of the substrate 202. The openings 212 may have any appropriate cross-sectional shape (e.g., circular, oval, square, rectangle, triangular, etc.).

In an example, the angled openings 212 may be formed using a laser to ablate the layer 240 of photoresist material. In another example, a three-dimensional lithography may be used to expose and develop the openings 212 (e.g., to develop the openings 212 simultaneously). For example, a patterned mask may be placed over the layer 240, and the substrate 202 along with the mask may be tilted at an angle with respect to an ultraviolet (UV) light source. Thus, the UV light may be exposed at an angle with respect to the substrate 202, thereby forming the openings 212 at an angle with respect to the substrate 202. In yet another example, the openings 212 may be formed (e.g., all the openings may be formed simultaneously) using an anisotropic etch process, an oblique angle dry etch process (e.g., the Bosch process), etc.

Thus, in an example, irrespective of the process used to form the openings 212, the openings 212 may be formed using a same process and substantially simultaneously.

Referring now to FIG. 2D, conductive materials may be deposited within the openings 212 (e.g., plated using a build-up process) to respectively form the probes 214. In an example, the deposition of the conductive material may be done using an electroless plating, or electrolytic plating.

Referring now to FIG. 2E, the top surfaces of the conductive material of the probes 214 may be polished to remove any material that may possibly protrude out of the openings 212. The polishing process may, for example, use lapping film, may be a chemical mechanical polish (CMP), and/or another appropriate polishing process.

In some embodiments, the contact tips 226 are optionally formed on the probes 214. For example, referring to FIG. 2F, to facilitate formation of the contact tips 226, a layer 218 of photoresist material may be deposited on the layer 204. In an example, the layer 226 may be relatively thin compared to the layer 204. For example, the layer 204 may be less than 10 μm.

Figure 2G:
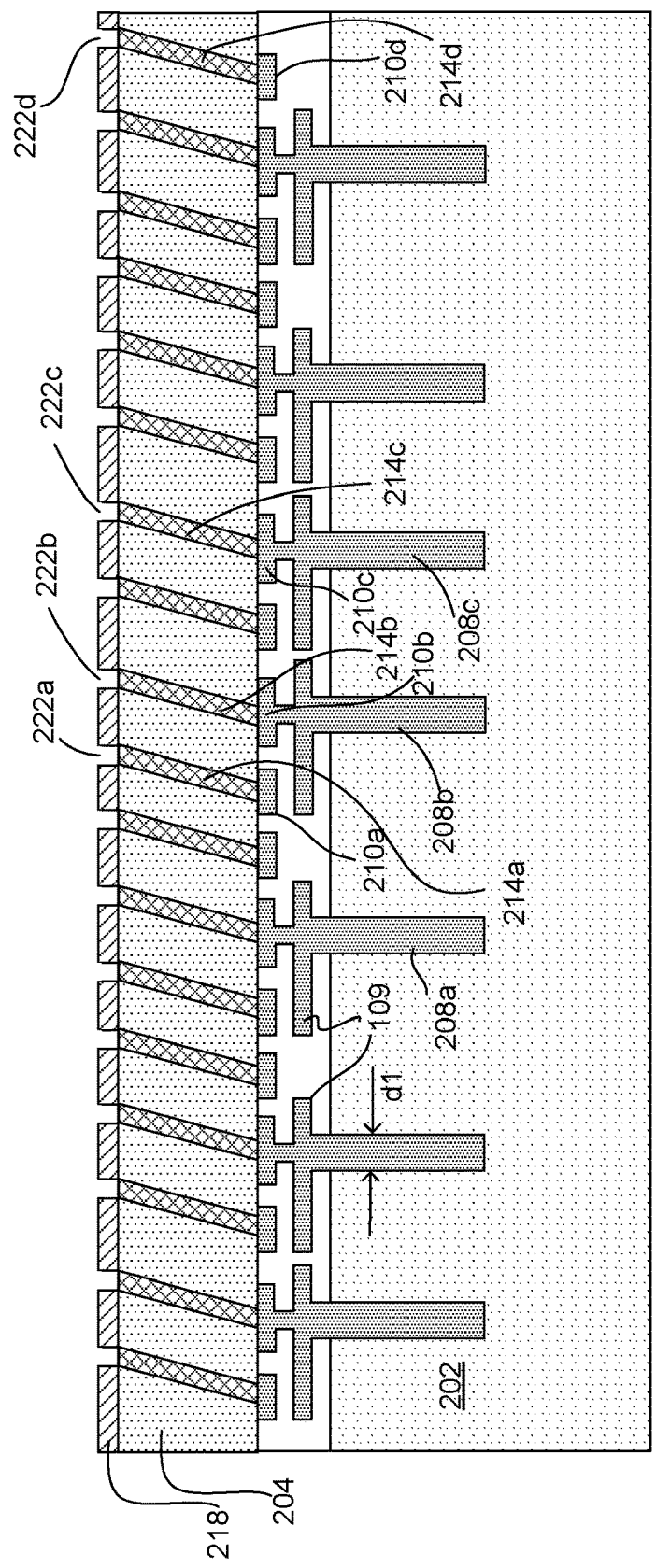

Referring now to FIG. 2G, the layer 218 of the photoresist material may be exposed and developed to form openings 222a. In an example, an opening 222 may be formed on top of a corresponding probe 214 (e.g., an opening 222 may be aligned with a corresponding probe 214). The openings 222 may have any appropriate cross-sectional shape (e.g., circular, oval, square, rectangle, triangular, etc.). In some examples, an opening 222 may have a cross-sectional area that is smaller than the cross-sectional area of a probe 214.

Figure 2H:
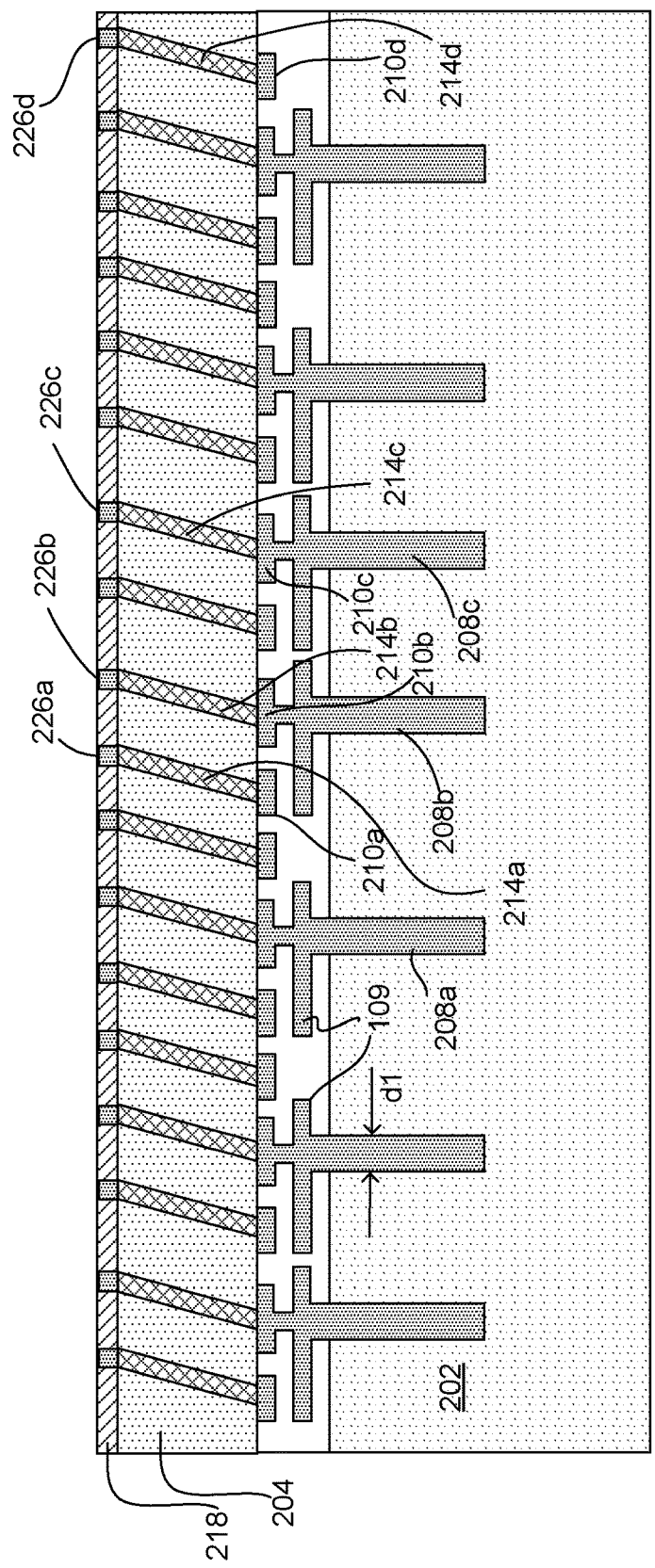

Referring now to FIG. 2H, conductive materials may be deposited within the openings 222 (e.g., plated using a build-up process) to respectively form the contact tips 226. In an example, the deposition of the conductive material may be done using an electroless plating, or electrolytic plating. In an example, the contact tips 226 may be of the same conductive material as the probes 214, or may be a different conductive material. Although not illustrated in FIG. 2H, once the contact tips 226 are formed, the top surfaces of the conductive material of the probes contact tips 226 may be polished to remove any material that may possibly protrude out of the openings 222.

Figure 2I:
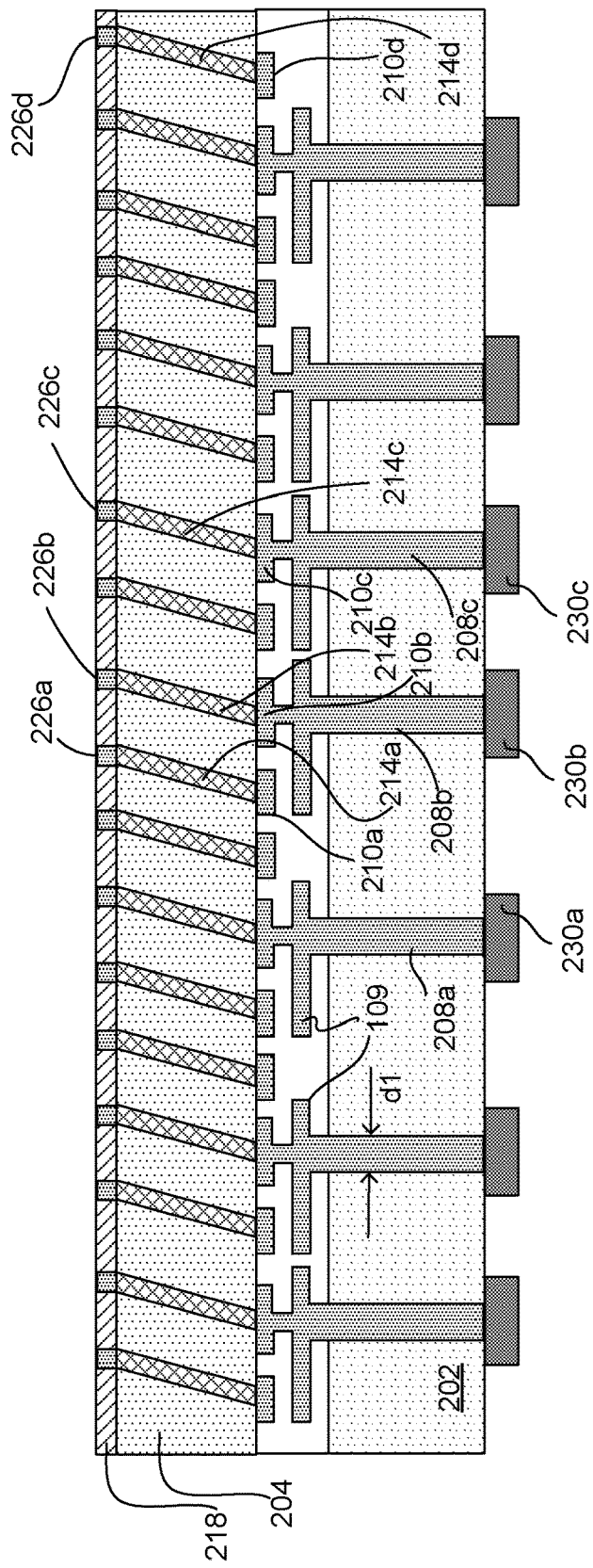

Referring now to FIG. 2I, the substrate 202 may be thinned to reveal the vias 208. For example, if the terminals 210 are formed on a first side of the substrate 202, a second side of the substrate may be grinded and/or etched, until the vias 208 are exposed. In some embodiments, terminals 230 (e.g., which may be bumps or conductive pads) may be formed on the vias 208 revealed by the selective removal of the substrate 202.

Figure 2J:
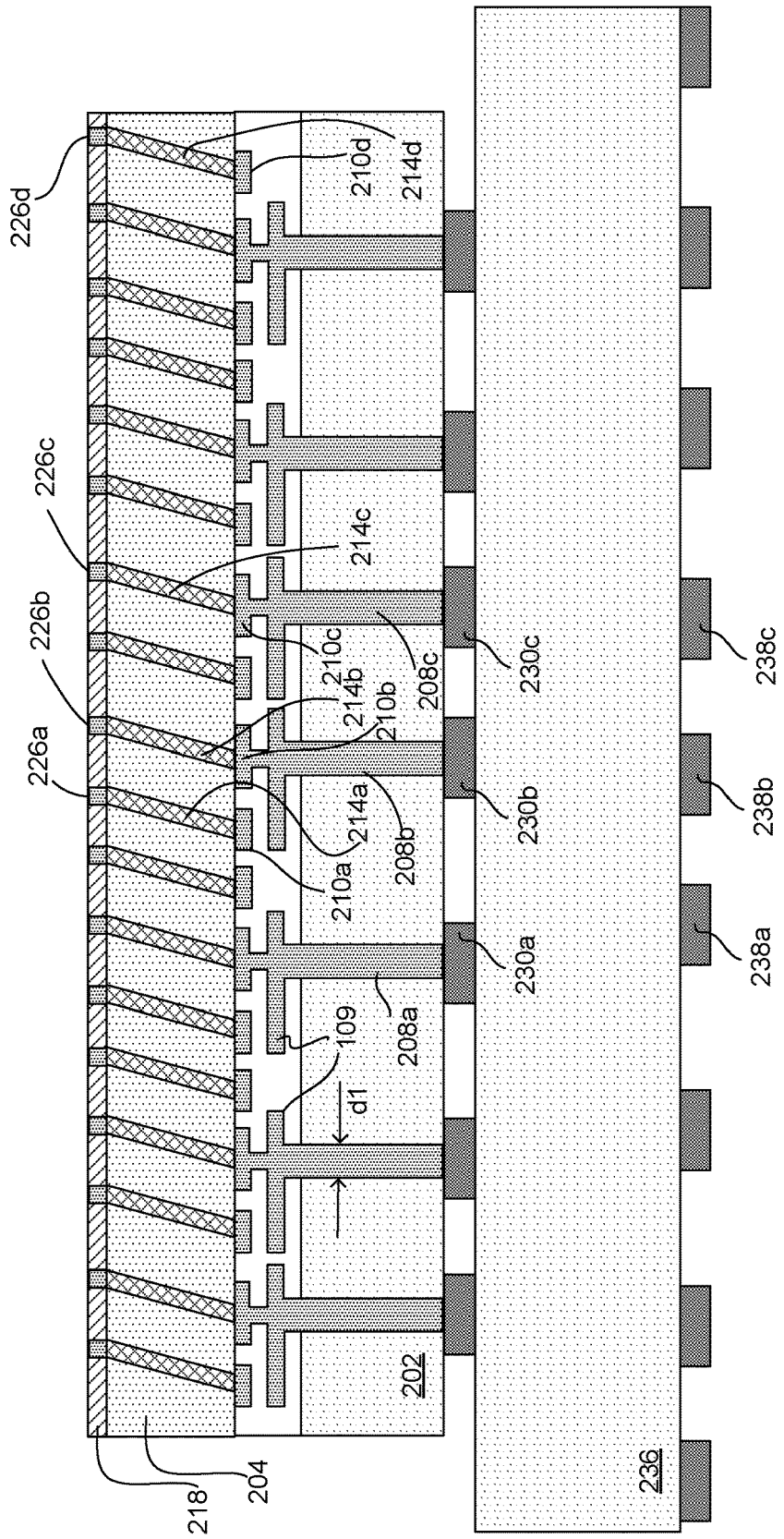

Referring now to FIG. 2J, a space transformer 236 may be attached to the terminals 230. In some embodiments, the operations of FIGS. 2A-2J may be performed at wafer level (e.g., the substrate 202 may be a wafer). Prior to the operations of FIG. 2J, the wafer may be singulated. In some embodiments, the space transformer 236 is attached to the terminals 230 using a C4 (controlled collapse chip connection) attach process.

Figure 2K:
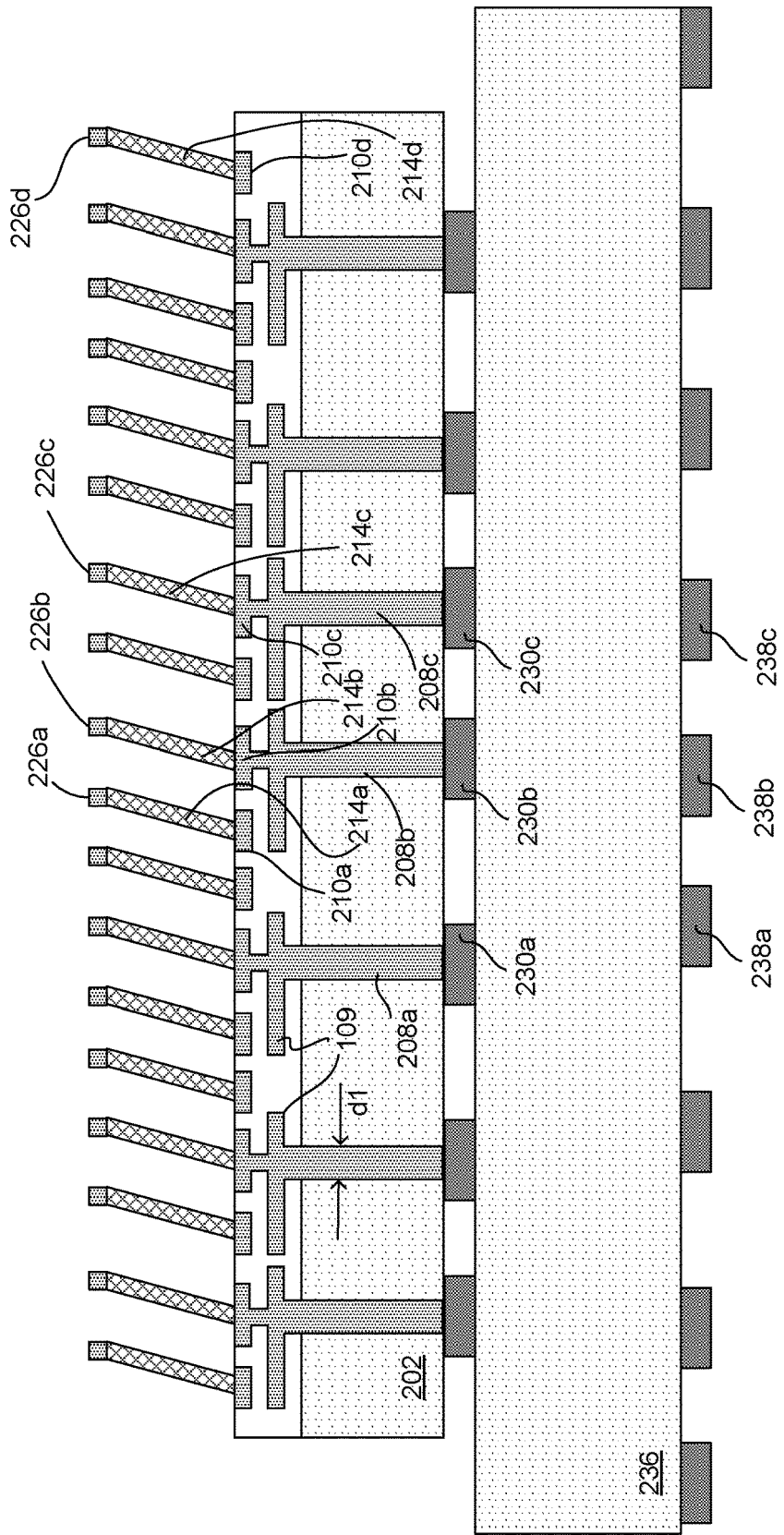

Referring now to FIG. 2K, the photoresist layers 204 and 218 may be removed and washed (e.g., using an appropriate solvent, plasma etching, etc.), to expose the probes 214, along with the contact tips 226. Thus, the structure of FIG. 2J may be similar to the apparatus 100a of FIG. 1.

In some embodiments, the apparatus 100a may be formed using a wafer level process. For example, as discussed herein, the operations of FIGS. 2A-2I may be performed at wafer level (e.g., the substrate 202 may be a wafer). However, in some other examples, at least some of the operations of FIGS. 2A-2K may be performed at a device level, e.g., after singulation of the wafer.

Furthermore, FIGS. 2A-2J may be appropriately modified, as would be readily envisioned by those skilled in the art based on the teachings of this disclosure. For example, in FIGS. 2A-2J, the probes 214 are initially formed using a wafer level process, then the wafer (e.g., the substrate 202) is singulated, and then the individual device is attached to the space transformer 236. In another example and although not illustrated in FIGS. 2A-2K, the wafer (e.g., the substrate 202) is singulated, then the individual device is attached to the space transformer 236, and then the probes 214 are formed at the device level.

FIGS. 3A-3E illustrate example processes for formation of the apparatus 100b of FIGS. 1C-1D, according to some embodiments. For example, FIGS. 3A-3E are cross-sectional views of the apparatus 100b evolving as example operations for formation of the apparatus 100b are performed.

Figure 3A:
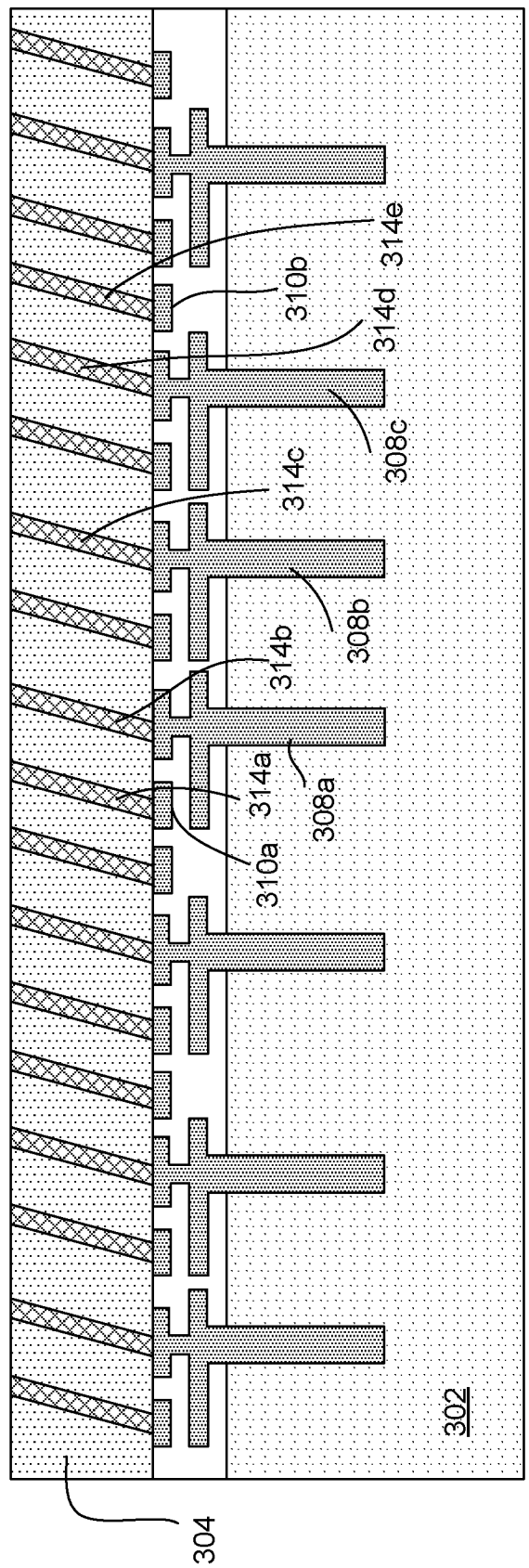
FIGS. 3A, 3B, 3C, 3D, and 3E illustrate example processes for formation of the apparatus of FIGS. 1C-1D, according to some embodiments.

Referring to FIG. 3A, illustrated is a structure that is similar to the structure illustrated in FIG. 2E. For example, the structure of FIG. 3A includes the substrate 302, the vias 308, the terminals 310, the probes 314, and the layer 304 of photoresist material. The structure of FIG. 3A may be formed similar to the processes of forming the structure of FIG. 2E.

Figure 3B:
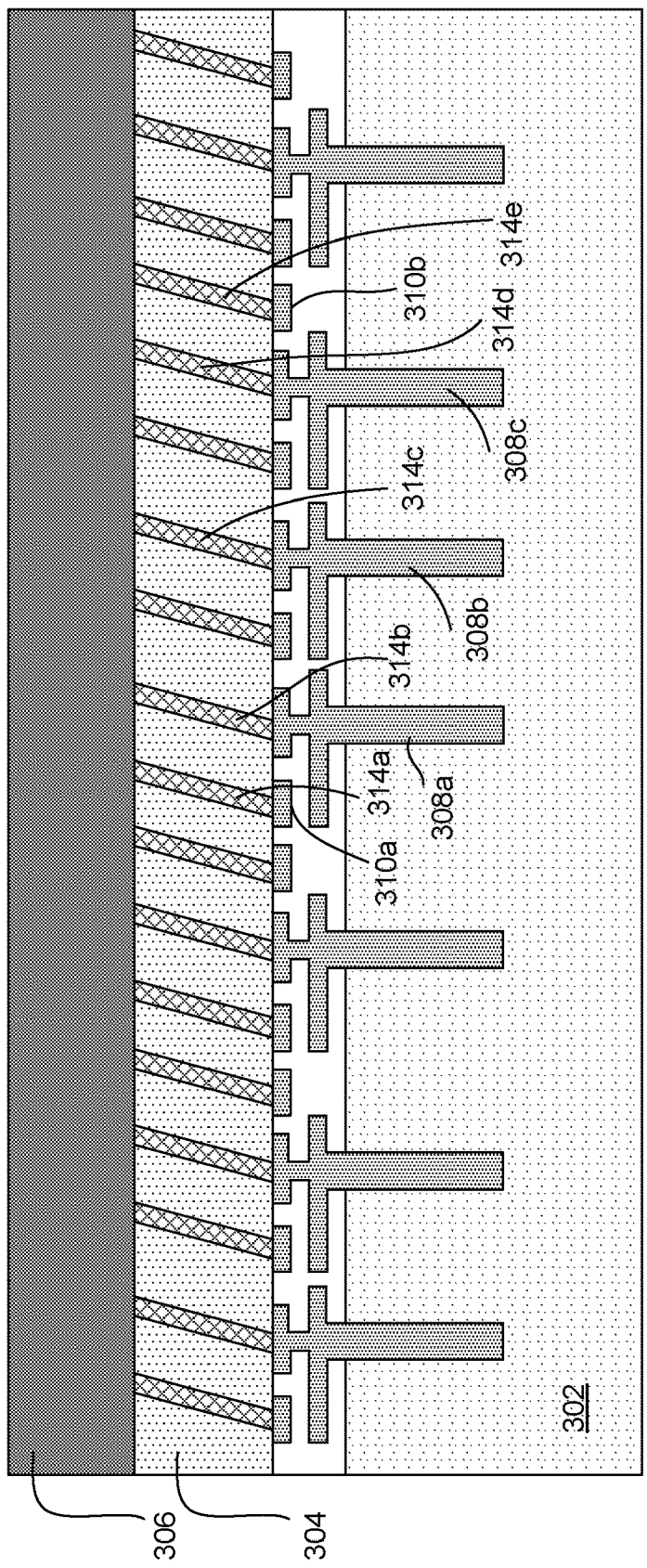
Figure 3C:
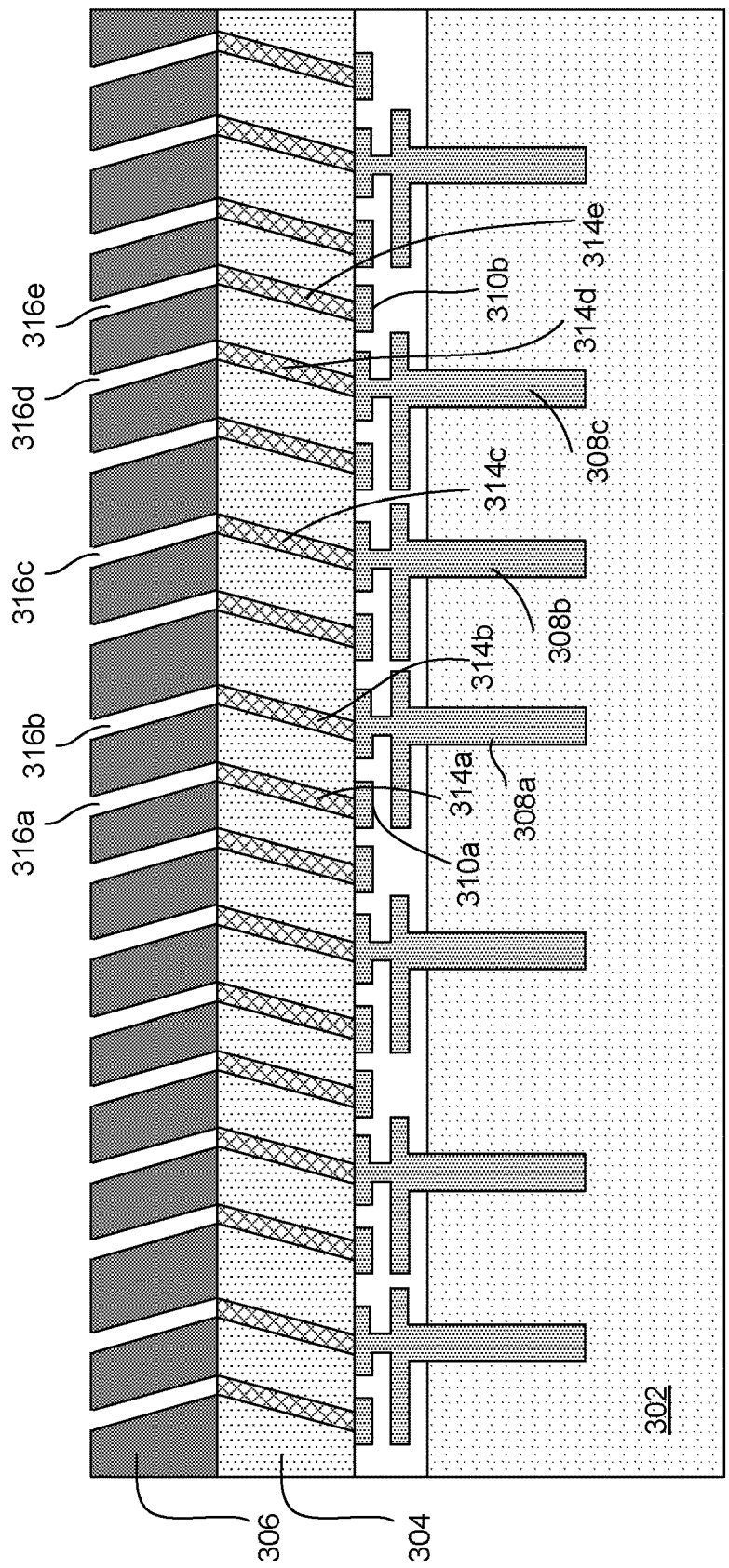

Referring to FIG. 3B, a layer 306 of photoresist material may be applied over the layer 304. Referring to FIG. 3C, openings 316 may be formed in the layer 306 (e.g., similar to the formation of the openings in FIG. 2C). Individual openings 316 may be aligned with the top surface of corresponding probes 314. As discussed with respect to FIG. 1D, an opening 316 may be angled with respect to a lower segment of the probe 314.

Figure 3D:
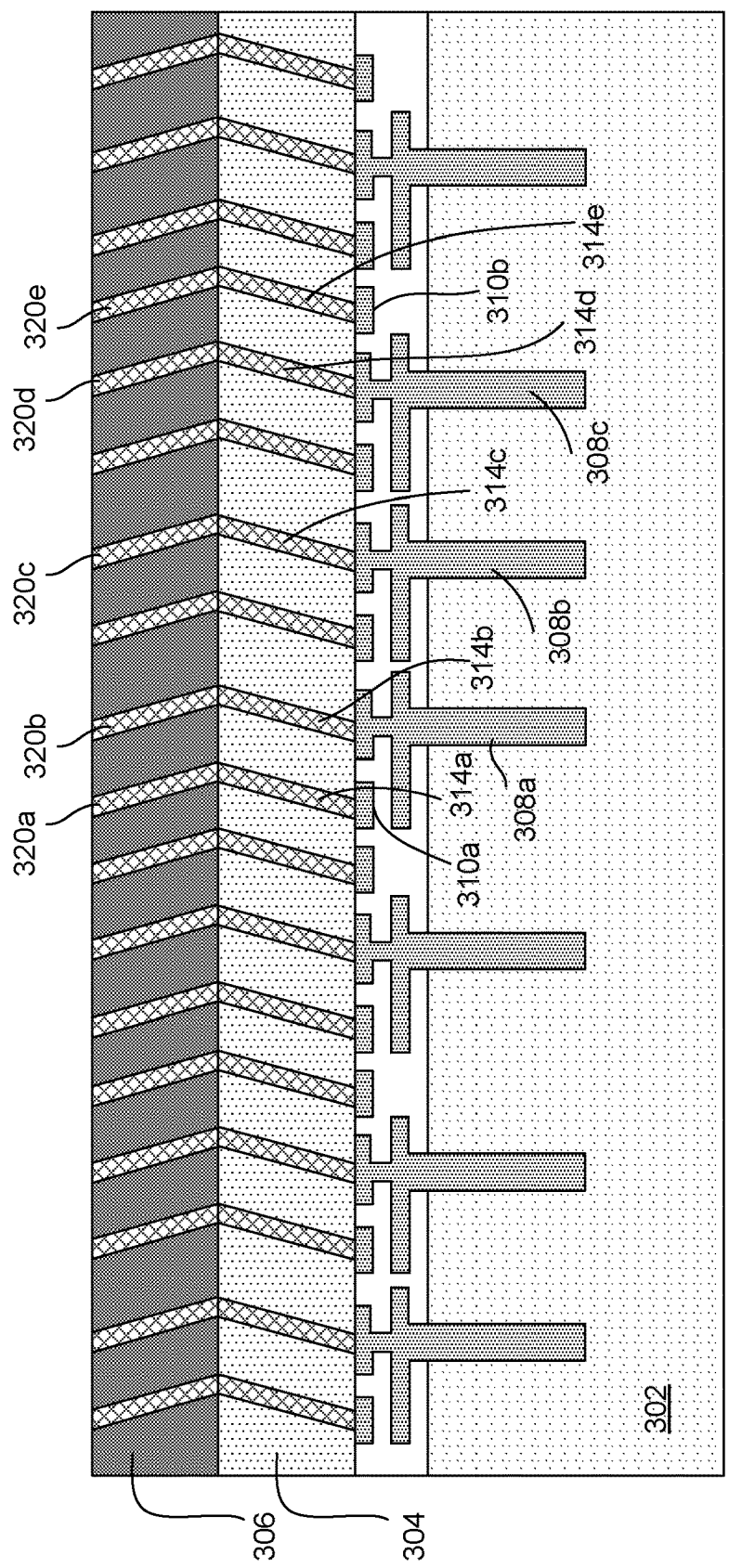

Referring to FIG. 3D, the openings 316 may be plated with conductive material and polished (e.g., similar to the operations discussed with respect to FIGS. 2D-2E), to form second segments 320 of the probes 314 (FIG. 1D illustrates two segments of a probe 314 is further details).

Figure 3E:
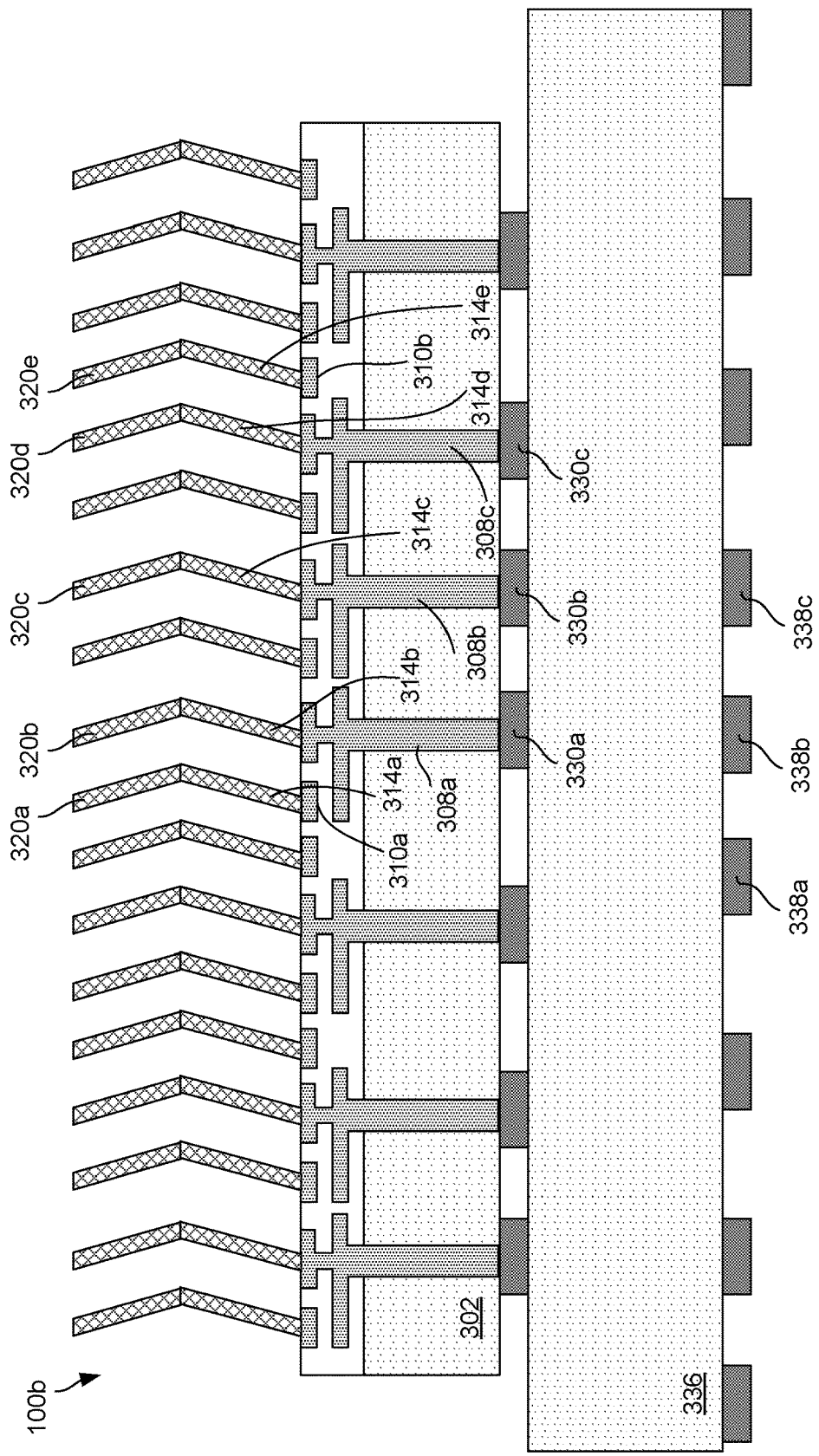

Referring to FIG. 3E, the substrate 302 may be selectively etched to expose the vias 308, the wafer 302 may be singulated, terminals 330 may be formed on the substrate 302, and the space transformer 336 may be attached to the terminals 330, e.g., as discussed in further details with respect to FIGS. 2I-2J. Subsequently, the layers 304 and 306 may be washed away (e.g., as discussed with respect to FIG. 2K), to form the probes 314.

In an example, the free end of the probes 314 may have corresponding contact tips (e.g., similar to the contact tips 226 of FIG. 1A-1B), although formation of such contact tips is not illustrated in FIGS. 3A-3E. Formation of such contact tips may be similar to the operations discussed with respect to FIGS. 2F-2H.

Although individual probe 314 of FIGS. 3A-3D has two segments, probes with more than two segments or having other complex structures (e.g., three segments, four segments, etc.) may also be possible. For example, forming a probe with three segments involve forming another layer of photoresist layer above the layer 306 in FIG. 3D, patterning the layer to form openings, and plating the openings with conductive material to form the third segments of the probes 314, e.g., similar to the operations discussed with respect to FIG. 3B-3D.

FIGS. 4A-4D illustrate example processes for formation of the apparatus 100c of FIG. 1E, according to some embodiments. For example, FIGS. 4A-4D are cross-sectional views of the apparatus 100c evolving as example operations for formation of the apparatus 100c are performed.

As discussed with respect to FIG. 1E, a length of individual probes 420 of the apparatus 100c may be relatively longer than a length of individual probes 214 of the apparatus 100a. Thus, for example, the probes 420 may have higher aspect ratio than that of the probes 214. In an example, unlike formation of the shorter probes 214 using a single photoresist layer 204 (e.g., as discussed with respect to FIGS. 2B-2E), it may not be possible to form the relatively long probes 420 using a single photoresist layer. Accordingly, formation of the long probes 420 may necessitate more than one photoresist layers, e.g., as discussed with respect to FIGS. 4A-4D.

Figure 4A:
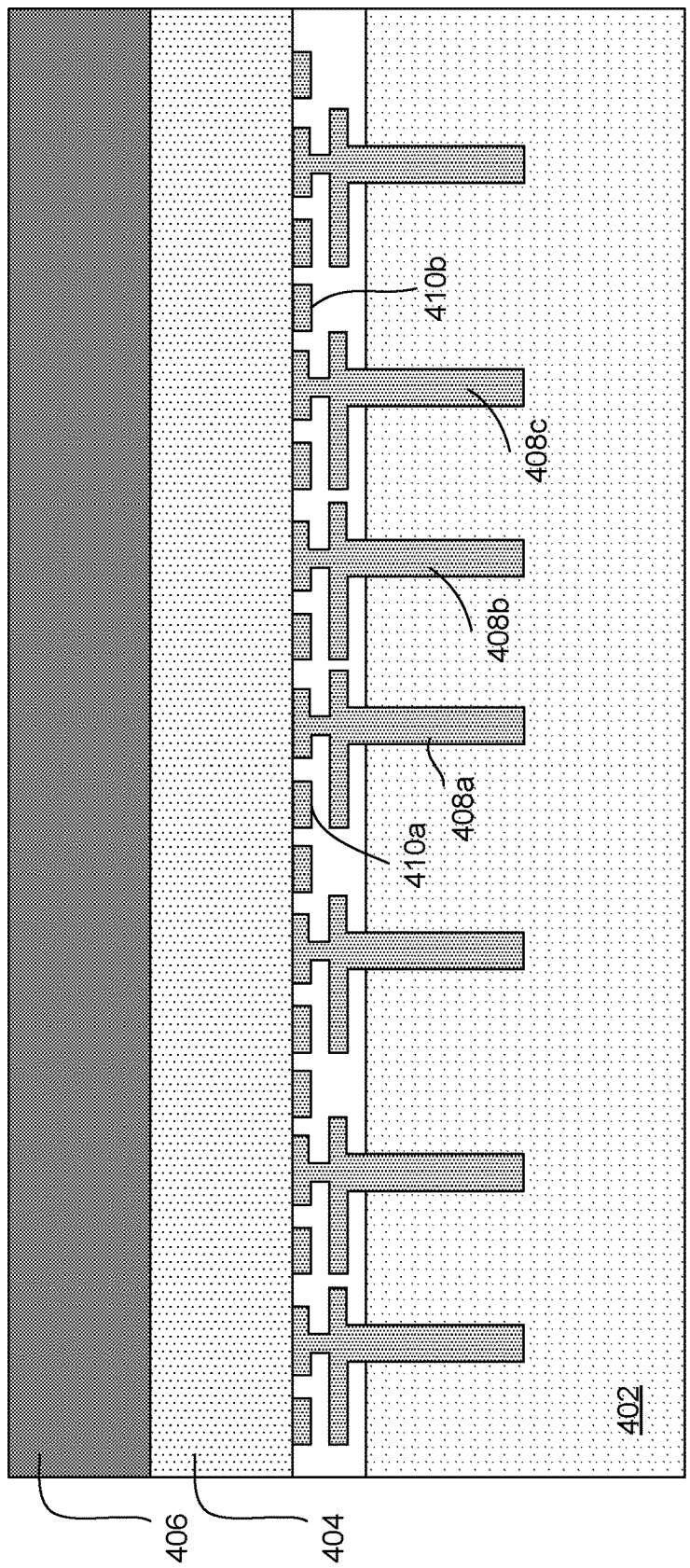
FIGS. 4A, 4B, 4C, and 4D illustrate example processes for formation of the apparatus of FIG. 1E, according to some embodiments.

Referring to FIG. 4A, illustrated is a component in which two stacked photoresist layers 404 and 406 are deposited on a substrate 402. As illustrated in FIG. 4A, vias 408 and terminals 410a may be formed on the substrate 402, prior to the deposition of the stacked layers 404 and 406. In an example, the two layers 404 and 406 may be deposited in two different operations—initially the layer 404 may be deposited over the substrate 402, and then the layer 406 may be deposited over the layer 404.

In some embodiments, properties of the layer 404 may be different from those of the layer 406. Merely as an example, the two layers 404 and 406 may be sensitive to different wavelengths of UV light. In an example, the layer 404 may be a positive photoresist material, such as PMAA (polymethyl methacrylate), which may require less than 240 nm wavelength light to be exposed. In an example, the layer 406 may be a negative photoresist material, such as SU-8 material, which may require about 365 nm wavelength light to be exposed. Other appropriate positive and negative photoresist materials may also be used for the layers 404 and 306, respectively.

Figure 4B:
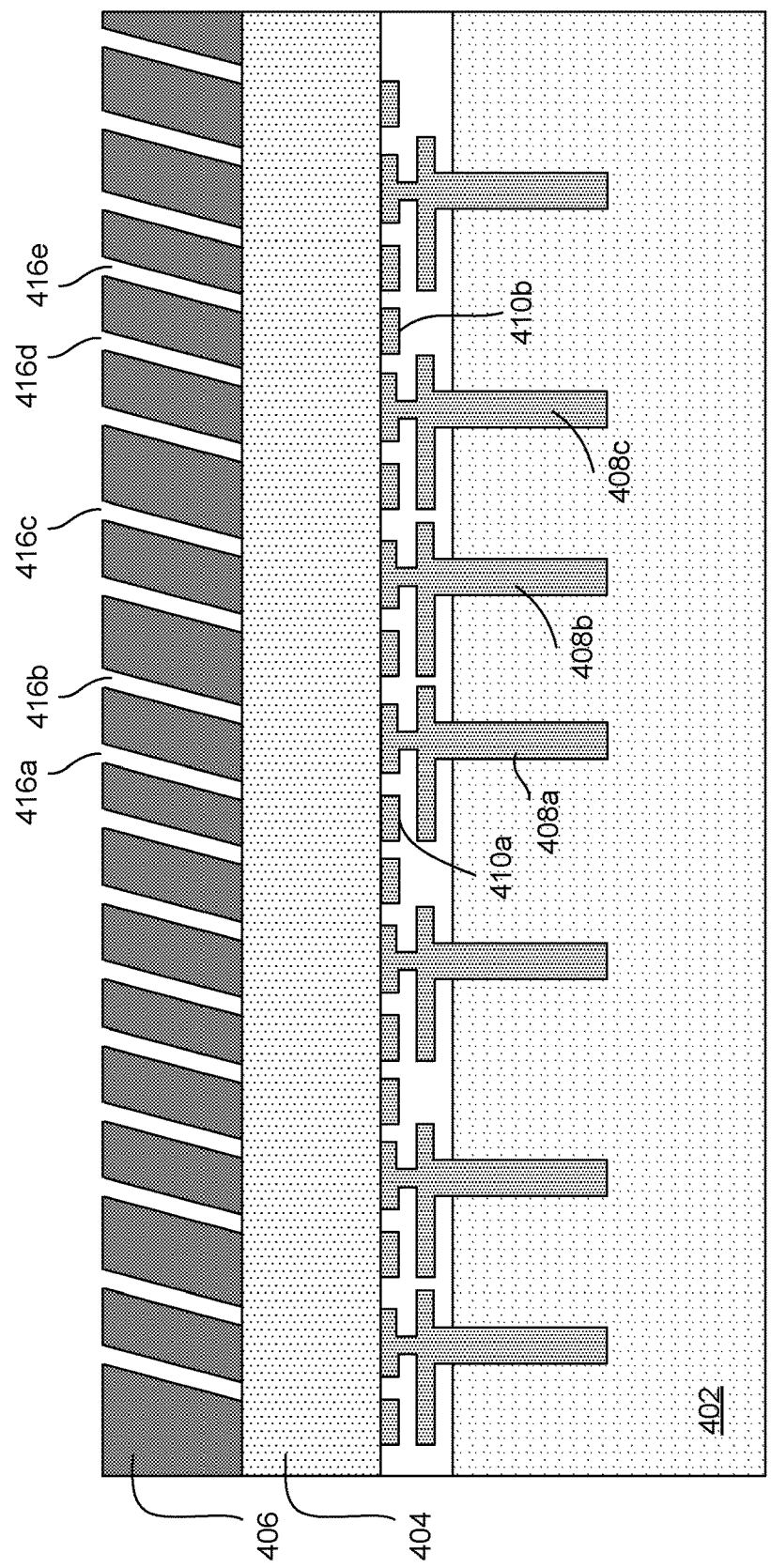

Referring now to FIG. 4B, the layer 406 may be exposed (e.g., through an appropriate patterned mask) to UV light of appropriate wavelength (e.g., 365 nm light) and then washed to form the openings 416. As the layer 404 is not sensitive to light of such wavelength, the layer 404 may not be impacted by this process. In some embodiments, the openings 416 are angled with respect to the plane of the substrate 402 (e.g., non-normal to the substrate 402). Formation of such angled openings have been discussed in further details with respect to FIG. 2C.

Figure 4C:
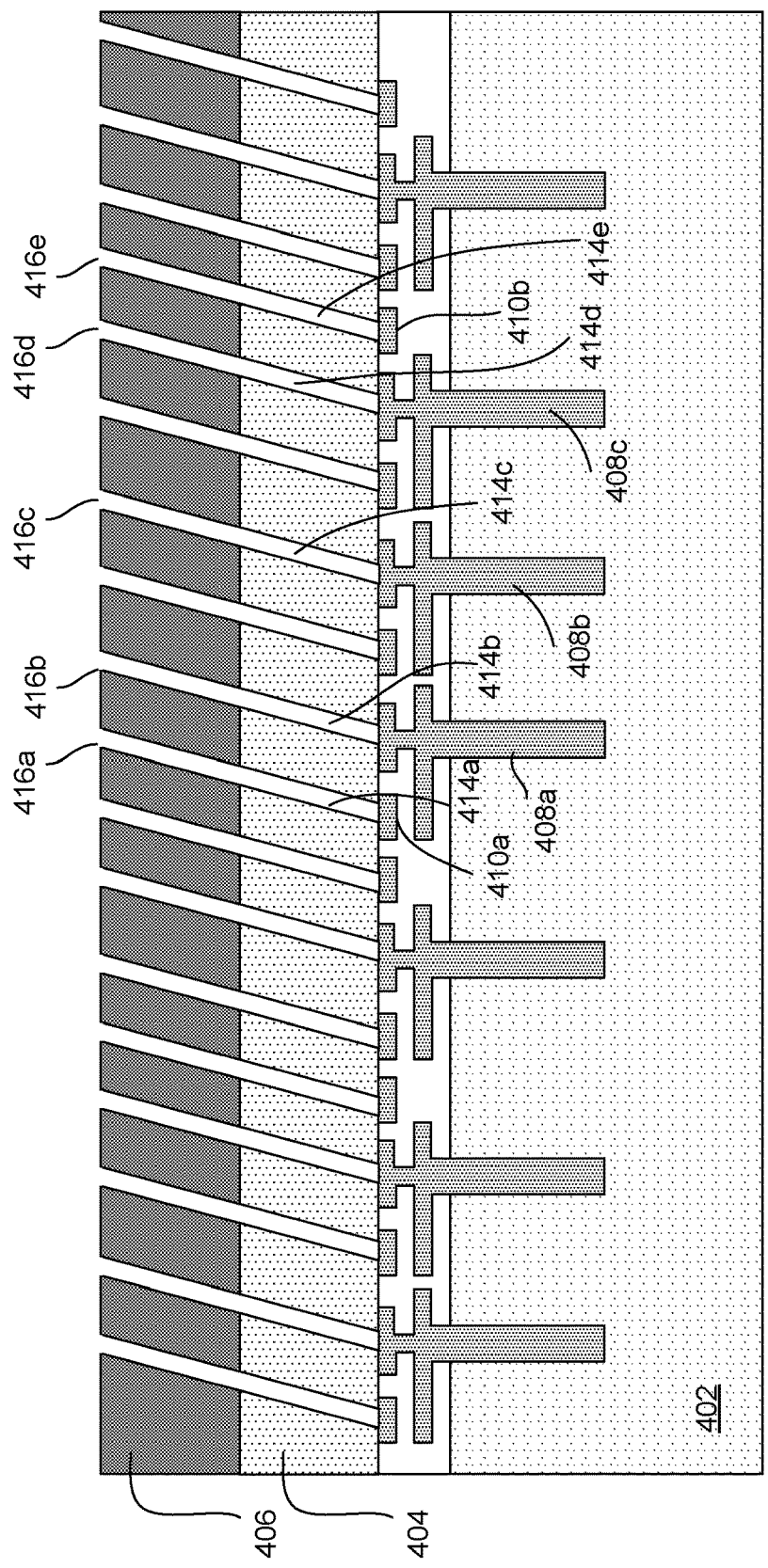

Referring now to FIG. 4C, the openings 416 are extended by forming openings 414 within the layer 404. For example, the layer 404 is now exposed to UV light of appropriate wavelength (e.g., less than 240 nm light). The layer 406 with the openings 416 can act as a patterned mask during the exposure of the layer 404. For example, the openings 416 in the layer 406 allow the 240 nm light to expose the layer 404. The layer 404 is then washed and developed to form the openings 414. As discussed with respect to FIG. 2C, the substrate 402 may be tilted at an angle with respect to the light source, e.g., to form the openings 414 and 416 at the non-normal angle with respect to the substrate 402.

Figure 4D:
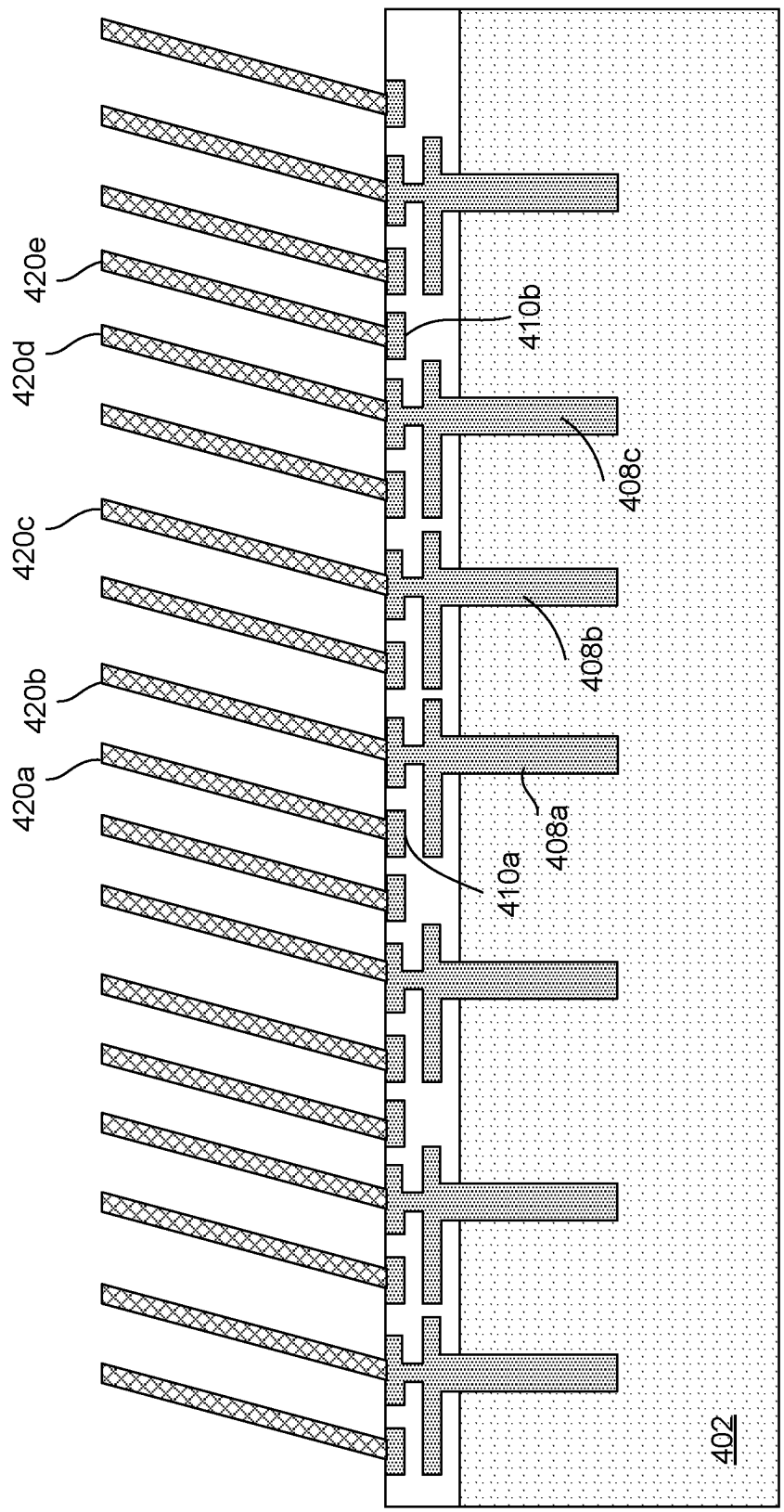

Referring to FIG. 4D, the openings 414 and 416 may be plated with conductive material and polished (e.g., similar to the operations discussed with respect to FIGS. 2D-2E). Subsequently, the layers 404 and 406 may be washed away (e.g., as discussed with respect to FIG. 2K), to form the probes 420.

Although not illustrated in FIGS. 4A-4D (and as illustrated in FIG. 1E), the substrate 402 may be singulated, and the space transformer 436 and the terminals 430 and 438 may be formed (e.g., similar to the operations discussed with respect to FIGS. 2I-2K), to form the apparatus 100c of FIG. 1E.

FIGS. 5A-5F illustrate example processes for formation of the apparatus 100d of FIG. 1F, according to some embodiments. For example, FIGS. 5A-5F are cross-sectional views of the apparatus 100d evolving as example operations for formation of the apparatus 100d are performed.

Referring to FIG. 5A, provided is a substrate 502 (e.g., which may be a silicon wafer), and terminals 510 and vias 508 formed thereon (e.g., similar to the component of FIG. 2A). The terminals 510 may be formed on a top side of the substrate 502, where the top side is opposite a bottom side of the substrate 502.

Referring to FIG. 5B, the substrate 502 may be thinned to an appropriate height by removing sections from the bottom side of the substrate 502, e.g., as discussed with respect to FIG. 2I. However, unlike FIG. 2I, in FIG. 5B the thinning of the substrate 502 may be relatively less, e.g., such that the vias 508 are not exposed.

Referring to FIG. 5C, openings 511 may be formed on the bottom side of the substrate 502. The openings 511 may be angled or non-normal with a plane of the substrate 502. Each opening 511 may contact a corresponding via 508. In an example, the openings 511 may be formed using a laser ablation process, an anisotropic etch process, a plasma etch process (e.g. Bosch process), and/or the like.

Figure 5E:
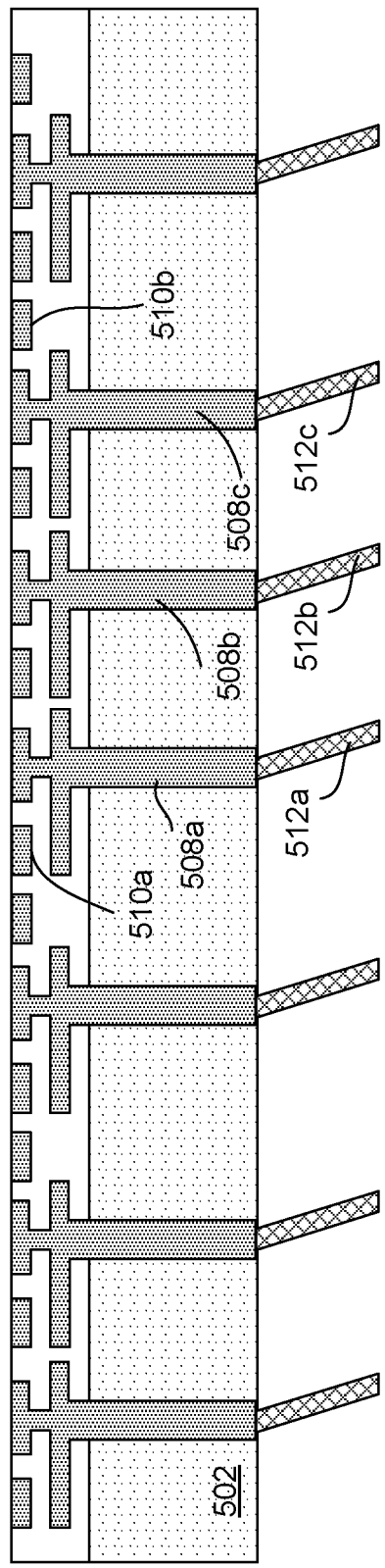

Referring to FIG. 5D, the openings 511 are plated with conductive material and possibly polished (e.g., as discussed with respect to FIGS. 2D-2E) to form the probes 512. Referring to FIG. 5E, section of the substrate 502 may be further removed from the bottom side of the substrate 502, e.g., etched using a wet etch process and/or a dry etch process. The selective removal of the substrate 502 may expose the free-standing probes 512.

Figure 5F:
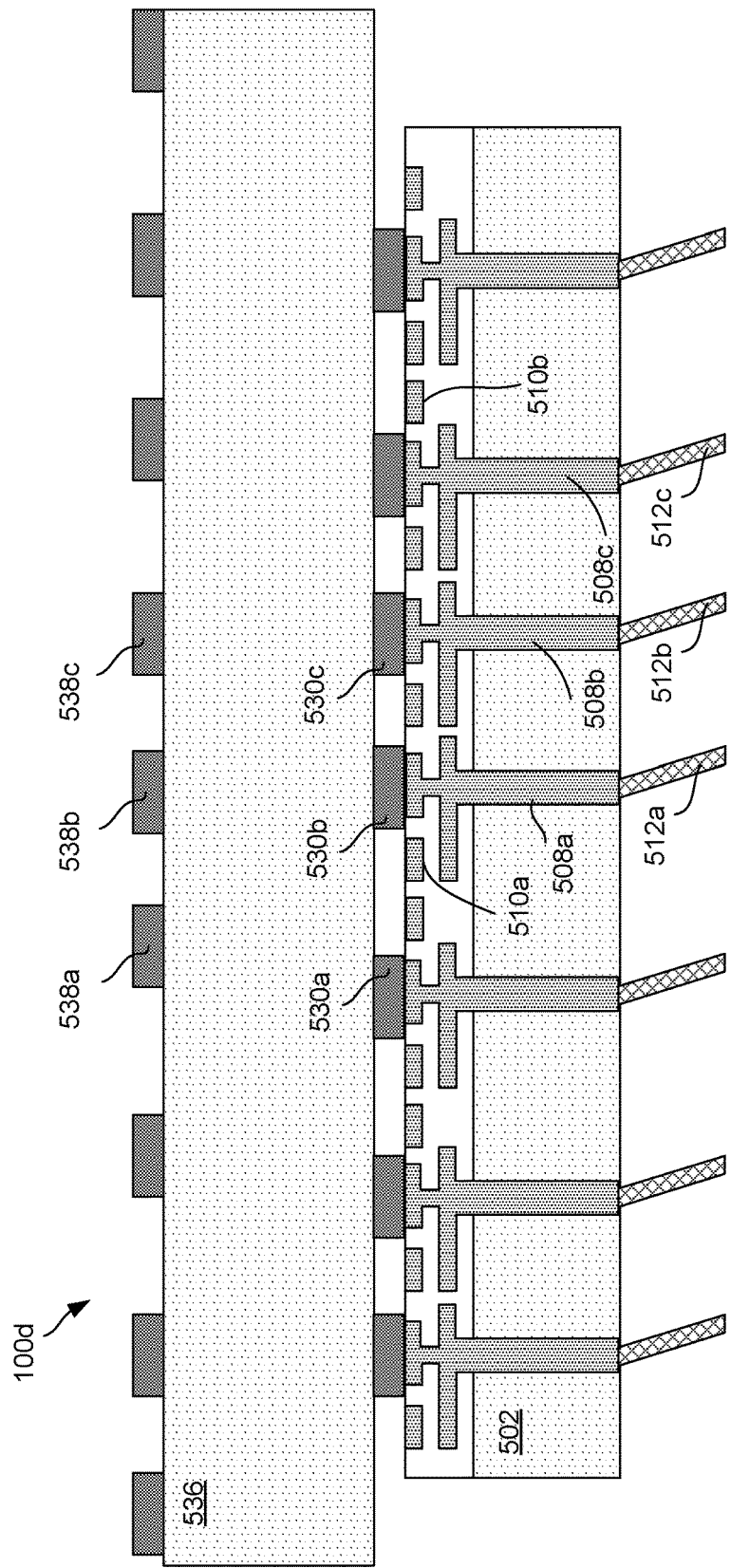

Referring to FIG. 5F, a space transformer 536 may be attached to the top side of the substrate 502, e.g., via the terminals 530. The space transformer 536 may also include terminals 538 for coupling to a back-end testing arrangement, such as a test card. The structure of FIG. 5F is similar to the apparatus 100d of FIG. 1E.

In an example, the free end of the probes 512 may have corresponding contact tips (e.g., similar to the contact tips 226 of FIG. 1A-1B), although formation of such contact tips is not illustrated in FIGS. 5A-5F. Formation of such contact tips may be similar to the operations discussed with respect to FIGS. 2F-2H.

Although the probes 512 of FIGS. 5A-5F has a single segment, probes with multiple segments may also be possible. For example, forming a probe with two segments involve forming a layer of photoresist layer below the substrate 502 in FIG. 5D, patterning the layer to form openings, and plating the openings with conductive material to form the second segments of the probes 512, e.g., similar to the operations discussed with respect to FIGS. 3B-3D.

Figure 6A:
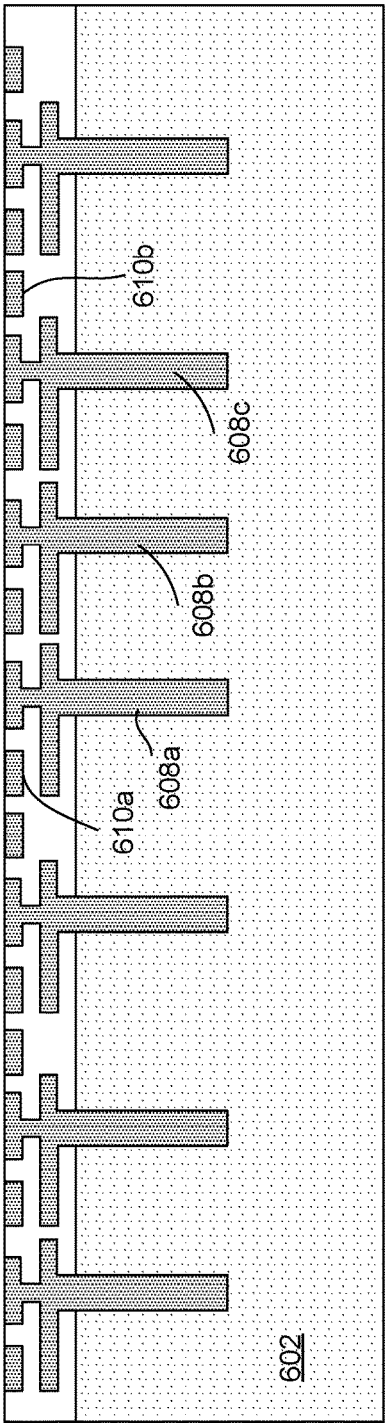
FIGS. 6A, 6B, and 6C illustrate example processes for formation of the apparatus of FIG. 1G, according to some embodiments.
Figure 6B:
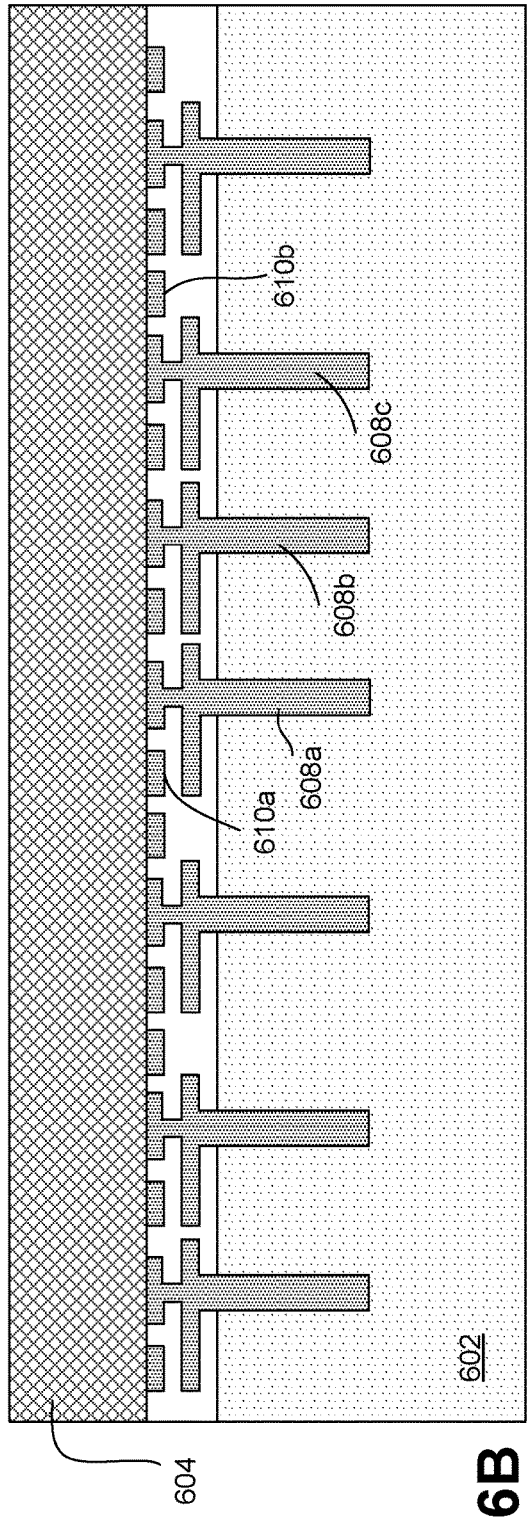
Figure 6C:
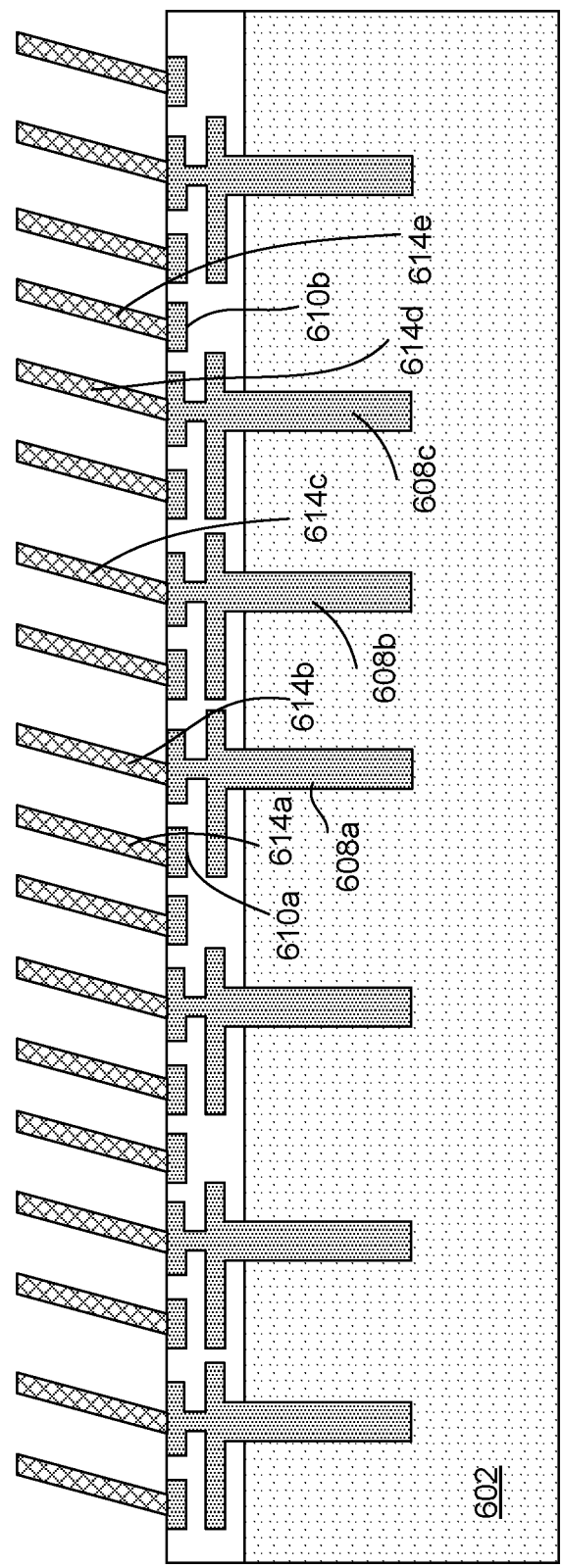

FIGS. 6A-6C illustrate example processes for formation of the apparatus 100e of FIG. 1G, according to some embodiments. For example, FIGS. 6A-6C are cross-sectional views of the apparatus 100e evolving as example operations for formation of the apparatus 100e are performed. In FIGS. 6A-6C, the probes 614 are formed directly from metal structure, e.g., instead of patterning any photoresist layer to form openings for metal deposition.

Referring to FIG. 6A, illustrated is a substrate 602 with terminals 610 and vias 608, e.g., similar to the component of FIG. 2A. Referring to FIG. 6B, a top surface of the substrate 602 may be plated with a layer 604 of conductive material, e.g., an appropriate metal. A thickness of the layer 604 may be based on a desired height of the probes 614. Referring to FIG. 6C, the layer 604 is selectively removed, e.g., using an anisotropic etch process, an oblique angle dry etch process, (e.g., the Bosch process), etc., to reveal the probes 614. Although not illustrated, a bottom side of the substrate 602 may be removed (e.g., the substrate 602 may be thinned), and a space transformer may be attached to the substrate, e.g., as discussed with respect to FIGS. 2I-2J.

As discussed with respect to FIGS. 2A-6C, the probes of an electrical test apparatus may be formed using three-dimensional batch fabrication processes. For example, multiple test probes (e.g., hundreds, thousands, or even tens or hundreds of thousands) may be formed on a substrate substantially at the same time.

In an example, because all the probes of an apparatus are manufactured in parallel (e.g., probes 214 of the apparatus 100a of FIGS. 1A-1B), the manufacturing time may be reduced compared to a one-at-a-time approach to assemble the test probes. For example, it would take the same amount of time to produce a solution with 1 test probe or hundreds of thousands of test probes. Thus, the cost curve or the time curve may no longer scale with the number of test probes. In addition, lithography based processes to form the test probes, as discussed herein, may reduce probe to probe variations (e.g., dimensions, x/y positional accuracy, etc.), even at relatively small pitch.

Figure 7:
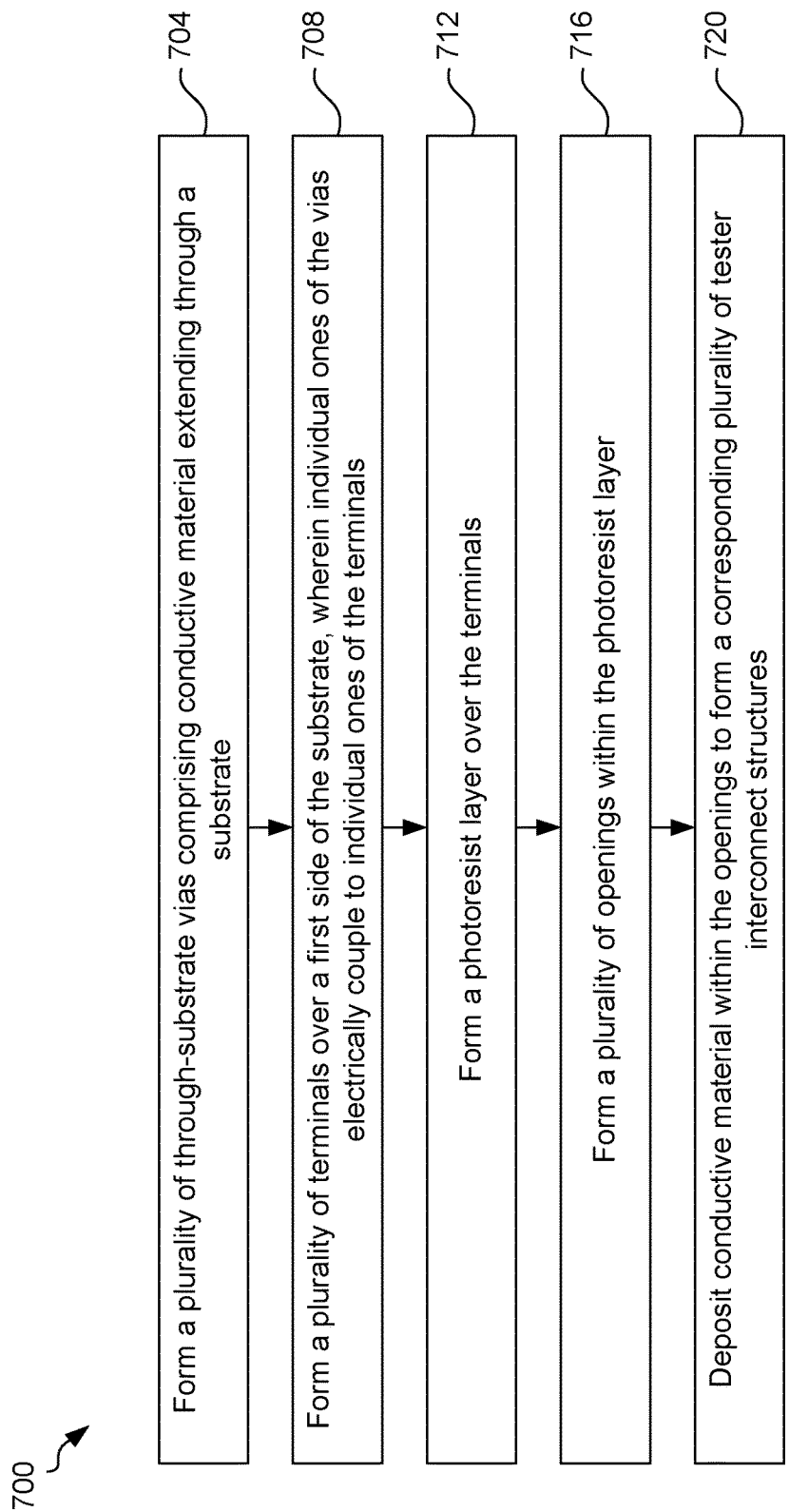
FIG. 7 is a flow diagram illustrating a method of forming an electrical test apparatus with multiple test probes, according to some embodiments.

FIG. 7 is a flow diagram illustrating a method 700 of forming an electrical test apparatus (e.g., one of the apparatus 100a, . . . , 100e) with multiple test probes, according to some embodiments. Although the blocks in the flowchart with reference to FIG. 7 are shown in a particular order, the order of the actions can be modified. Thus, the illustrated embodiments can be performed in a different order, and some actions/blocks may be performed in parallel. Some of the blocks and/or operations listed in FIG. 7 may be optional in accordance with certain embodiments. The numbering of the blocks presented is for the sake of clarity and is not intended to prescribe an order of operations in which the various blocks must occur.

Various operations of the method 700 are discussed herein below with respect to formation of the apparatus 100a of FIG. 1A-1B, e.g., as discussed with respect to FIGS. 2A-2K. However, it would be readily apparent to those skilled in the art that the operations of the method 700 may also be applicable at least in part to form the apparatus 100b, . . . , 100e as well.

In an example, at 704 of the method 700, a plurality of through-substrate vias (e.g., vias 208) comprising conductive material may be formed, where the vias may extend through a substrate (e.g., substrate 202), e.g., as discussed with respect to FIG. 2A. In an example, at 708 of the method 700, a plurality of terminals (e.g., terminals 210) may be formed over a first side of the substrate, where individual ones of the vias may electrically couple to individual ones of the terminals, e.g., as discussed with respect to FIG. 2A. In an example, at 712 of the method 700, a photoresist layer (e.g., layer 204) may be formed over the terminals, e.g., as discussed with respect to FIG. 2B.

In an example, at 716 of the method 700, a plurality of openings (e.g., openings 212) may be formed within the photoresist layer, e.g., as discussed with respect to FIG. 2C. In some embodiments, individual ones of the openings are over corresponding ones of the terminals, and the openings extend from the substrate in substantially the same direction, non-normal from a plane of the substrate. In an example, at 716 of the method 700, conductive material may be deposited within the openings to form a corresponding plurality of tester interconnect structures (e.g., tester interconnect structures 214), e.g., as discussed with respect to FIGS. 2D-2E.

Figure 8:
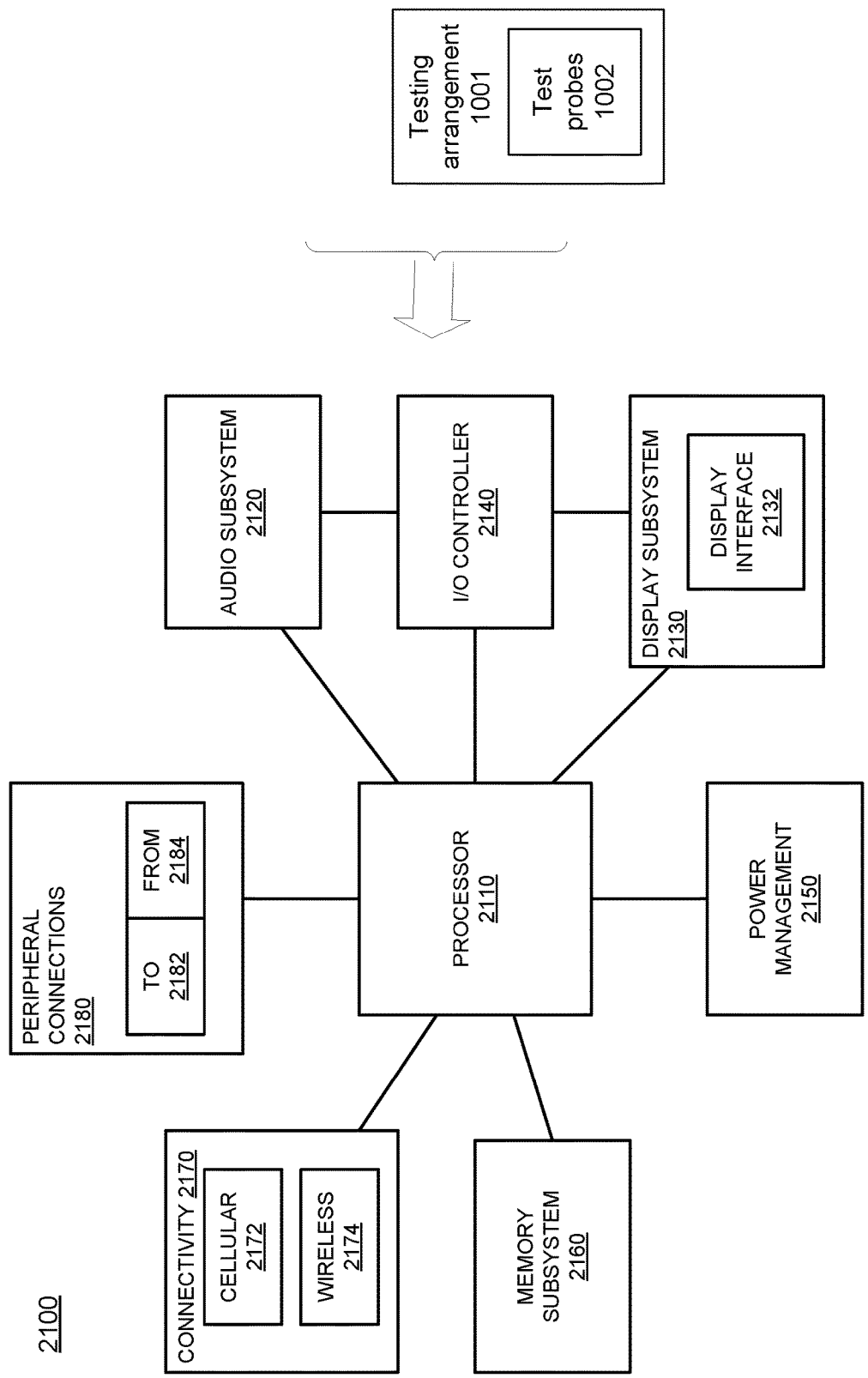
FIG. 8 illustrates a computing device or a SoC (System-on-Chip) including a testing arrangement that includes a plurality of tester interconnect structures, according to some embodiments.

FIG. 8 illustrates a computing device or a SoC (System-on-Chip) 2100 including a testing arrangement 1001 that includes a plurality of tester interconnect structures 1002, according to some embodiments. It is pointed out that those elements of FIG. 8 having the same reference numbers (or names) as the elements of any other figure can operate or function in any manner similar to that described, but are not limited to such.

In some embodiments, computing device 2100 represents an appropriate computing device, such as a computing tablet, a server, a workstation, a mobile phone or smart-phone, a laptop, a desktop, an IOT device, a wireless-enabled e-reader, or the like. It will be understood that certain components are shown generally, and not all components of such a device are shown in computing device 2100.

In some embodiments, computing device 2100 includes a first processor 2110. The various embodiments of the present disclosure may also comprise a network interface within 2170 such as a wireless interface so that a system embodiment may be incorporated into a wireless device, for example, cell phone or personal digital assistant. The processor 2110 may be a SoC or a computing unit.

In one embodiment, processor 2110 can include one or more physical devices, such as microprocessors, application processors, microcontrollers, programmable logic devices, or other processing means. The processing operations performed by processor 2110 include the execution of an operating platform or operating system on which applications and/or device functions are executed. The processing operations include operations related to I/O (input/output) with a human user or with other devices, operations related to power management, and/or operations related to connecting the computing device 2100 to another device. The processing operations may also include operations related to audio I/O and/or display I/O.

In one embodiment, computing device 2100 includes audio subsystem 2120, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 2100, or connected to the computing device 2100. In one embodiment, a user interacts with the computing device 2100 by providing audio commands that are received and processed by processor 2110.

Display subsystem 2130 represents hardware (e.g., display devices) and software (e.g., drivers) components that provide a visual and/or tactile display for a user to interact with the computing device 2100. Display subsystem 2130 includes display interface 2132, which includes the particular screen or hardware device used to provide a display to a user. In one embodiment, display interface 2132 includes logic separate from processor 2110 to perform at least some processing related to the display. In one embodiment, display subsystem 2130 includes a touch screen (or touch pad) device that provides both output and input to a user.

I/O controller 2140 represents hardware devices and software components related to interaction with a user. I/O controller 2140 is operable to manage hardware that is part of audio subsystem 2120 and/or display subsystem 2130. Additionally, I/O controller 2140 illustrates a connection point for additional devices that connect to computing device 2100 through which a user might interact with the system. For example, devices that can be attached to the computing device 2100 might include microphone devices, speaker or stereo systems, video systems or other display devices, keyboard or keypad devices, or other I/O devices for use with specific applications such as card readers or other devices.

As mentioned above, I/O controller 2140 can interact with audio subsystem 2120 and/or display subsystem 2130. For example, input through a microphone or other audio device can provide input or commands for one or more applications or functions of the computing device 2100. Additionally, audio output can be provided instead of, or in addition to display output. In another example, if display subsystem 2130 includes a touch screen, the display device also acts as an input device, which can be at least partially managed by I/O controller 2140. There can also be additional buttons or switches on the computing device 2100 to provide I/O functions managed by I/O controller 2140.

In one embodiment, I/O controller 2140 manages devices such as accelerometers, cameras, light sensors or other environmental sensors, or other hardware that can be included in the computing device 2100. The input can be part of direct user interaction, as well as providing environmental input to the system to influence its operations (such as filtering for noise, adjusting displays for brightness detection, applying a flash for a camera, or other features).

In one embodiment, computing device 2100 includes power management 2150 that manages battery power usage, charging of the battery, and features related to power saving operation. Memory subsystem 2160 includes memory devices for storing information in computing device 2100. Memory can include nonvolatile (state does not change if power to the memory device is interrupted) and/or volatile (state is indeterminate if power to the memory device is interrupted) memory devices. Memory subsystem 2160 can store application data, user data, music, photos, documents, or other data, as well as system data (whether long-term or temporary) related to the execution of the applications and functions of the computing device 2100. In one embodiment, computing device 2100 includes a clock generation subsystem 2152 to generate a clock signal.

Elements of embodiments are also provided as a machine-readable medium (e.g., memory 2160) for storing the computer-executable instructions (e.g., instructions to implement any other processes discussed herein). The machine-readable medium (e.g., memory 2160) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 2170 includes hardware devices (e.g., wireless and/or wired connectors and communication hardware) and software components (e.g., drivers, protocol stacks) to enable the computing device 2100 to communicate with external devices. The computing device 2100 could be separate devices, such as other computing devices, wireless access points or base stations, as well as peripherals such as headsets, printers, or other devices.

Connectivity 2170 can include multiple different types of connectivity. To generalize, the computing device 2100 is illustrated with cellular connectivity 2172 and wireless connectivity 2174. Cellular connectivity 2172 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 2174 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 2180 include hardware interfaces and connectors, as well as software components (e.g., drivers, protocol stacks) to make peripheral connections. It will be understood that the computing device 2100 could both be a peripheral device ("to" 2182) to other computing devices, as well as have peripheral devices ("from" 2184) connected to it. The computing device 2100 commonly has a "docking" connector to connect to other computing devices for purposes such as managing (e.g., downloading and/or uploading, changing, synchronizing) content on computing device 2100. Additionally, a docking connector can allow computing device 2100 to connect to certain peripherals that allow the computing device 2100 to control content output, for example, to audiovisual or other systems.

In addition to a proprietary docking connector or other proprietary connection hardware, the computing device 2100 can make peripheral connections 2180 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

In some embodiments, the computing device 2100 may be used to test various DUTs, e.g., the DUT 101 of FIG. 1B. For example, the computing device 2100 may include a testing arrangement 1001, which may include the probes 1002. The probes 1002 may be similar to any of the probes discussed herein, and may be manufactured using one or more of the processes discussed with respect to FIGS. 2A-6C. In some embodiments, the processor 2110 may execute instructions stored in a memory of the memory subsystem 2160, e.g., to test one or more DUTs.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

Example 1

An electrical-test apparatus, comprising a MEMS array, wherein the MEMS array further comprises: a plurality of tester interconnect structures comprising electrically conductive material cantilevered from first terminals on a first side of a substrate; and a plurality of through-substrate vias that extend through the substrate, the vias comprising electrically conductive material, and wherein individual ones of the vias electrically couple individual ones of the tester interconnect structures to corresponding ones of second terminals on a second side of the substrate.

Example 2

The apparatus of example 1 or any other example, wherein the tester interconnect structures have a first pitch, and wherein the apparatus further comprises a space transformer including a plurality of traces, wherein the traces connect the second terminals to third terminals, the second terminals have a second pitch, greater than the first pitch, and the third terminals have a third pitch, greater than the second pitch.

Example 3

The apparatus of example 1 or any other example, wherein: the substrate comprises a crystal comprising silicon; the first terminals have a first cross-sectional length that is at least as large as a second cross-sectional length of the tester interconnect structures; and the second cross-sectional length is no more than 30 microns.

Example 4

The apparatus of any of examples 1-3 or any other example, wherein the probe array further comprises one or more interconnect levels, and the interconnect levels electrically couple the first terminals to the vias, or the interconnect levels electrically couple the vias to the second terminals.

Example 5

The apparatus of any of examples 1-3 or any other example, wherein the probe array comprises at least 5,000 of the tester interconnect structures, and wherein individual ones of the tester interconnect structures protrude by at least 100 µm from a corresponding anchor point on the substrate.

Example 6

The apparatus of example 5 or any other example, wherein the tester interconnect structures extend from the substrate in substantially the same direction from a plane of the substrate.

Example 7

The apparatus of example 5 or any other example, wherein individual ones of the tester interconnect structures have a bend between a free end of the tester interconnect structure and the anchor point.

Example 8

An electrical-test system comprising: a memory to store instructions; a processor to execute the instructions to test Integrated Circuit (IC) devices; and a MEMS array, wherein the MEMS array further comprises: a plurality of tester interconnect structures comprising electrically conductive material cantilevered from first terminals on a first side of a substrate, wherein the tester interconnect structures have a first diameter, and a plurality of through-substrate vias that extend through the substrate, the vias comprising electrically conductive material and having a second diameter, larger than the first diameter, and wherein individual ones of the vias electrically couple individual ones of the tester interconnect structures to corresponding ones of second terminals on a second side of the substrate, wherein the tester interconnect structures are electrically coupled to the processor through the first terminals, the plurality of vias, and the second terminals, and wherein the processor is to test an IC device through contact between the tester interconnect structures and a corresponding plurality of interconnect structures of the IC device.

Example 9

The system of example 8 or any other example, wherein the tester interconnect structures extend from the substrate in substantially the same direction, non-normal from a plane of the substrate.

Example 10

The system of any of examples 8-9 or any other example, wherein individual ones of the tester interconnect structures have a bend between a free end of the tester interconnect structure and an attached end anchored to the substrate.

Example 11

A method comprising: forming a plurality of through-substrate vias comprising conductive material extending through a substrate; forming a plurality of terminals over a first side of the substrate, wherein individual ones of the vias electrically couple to individual ones of the terminals; forming a photoresist layer over the terminals; forming a plurality of openings within the photoresist layer, wherein individual ones of the openings are over corresponding ones of the terminals, and wherein the openings extend from the substrate in substantially the same direction, non-normal from a plane of the substrate; and depositing conductive material within the openings to form a corresponding plurality of tester interconnect structures.

Example 12

The method of example 11 or any other example, wherein the photoresist layer is a first photoresist layer, wherein the openings are first openings, wherein the conductive material deposited within the first openings is a first conductive material, and wherein the method further comprises: forming a second photoresist layer over the first photoresist layer; forming a second plurality of openings within the second photoresist layer, wherein individual ones of the second openings are on corresponding ones of the tester interconnect structures; and depositing a second conductive material within the second openings to correspondingly extend the tester interconnect structures.

Example 13

The method of example 12 or any other example, wherein a first end of a first of the second openings is formed on a first tester interconnect structure, and the first opening is at an angle with respect to the first tester interconnect structure, the angle being less than 180 degrees.

Example 14

The method of example 12 or any other example, wherein depositing the second conductive material forms a plurality of contact tips on the plurality of tester interconnect structures.

Example 15

The method of example 12 or any other example, wherein: the plurality of tester interconnect structures comprises a first tester interconnect structure; and the first tester interconnect structure includes: a first segment comprising the first conductive material, and a second segment comprising the second conductive material.

Example 16

The method of example 11 or any other example, wherein the photoresist layer is a first photoresist layer, wherein the openings are first openings, wherein the conductive material is a first conductive material, and wherein the method further comprises: forming a second photoresist layer over the first plurality of terminals, such that the second photoresist layer is interleaved between the first plurality of terminals and the first photoresist layer; forming a second plurality of openings within the second photoresist layer, prior to depositing the conductive material within the first openings and subsequent to forming the first openings, wherein individual ones of the second openings are aligned with corresponding ones of the first openings, and wherein depositing the conductive material within the first openings comprises: depositing the conductive material within the first and second openings to form the tester interconnect structures.

Example 17

The method of any of examples 11-16 or any other example, further comprising: removing the photoresist layer to expose the plurality of tester interconnect structures.

Example 18

The method of any of examples 11-16 or any other example, further comprising: forming a space transformer, the space transformer electrically coupling individual ones of the tester interconnect structures to a test card comprising circuitry to test an Integrated Circuit (IC) device.

Example 19

A method comprising: forming a plurality of through-substrate vias comprising conductive material extending through a substrate; forming a plurality of terminals on the substrate, individual ones of the terminals coupled to corresponding ones of the vias; depositing a layer of conductive material over the substrate, the layer of conductive material at least in part encapsulating the plurality of terminals; and selectively removing a portion of the conductive material to form a plurality of tester interconnect structures on the corresponding plurality of terminals.

Example 20

The method of example 19 or any other example, wherein selectively removing the portion of conductive material comprises: etching the conductive material anisotropically in a direction non-normal to a plane of the substrate.

Example 21

An apparatus comprising: means for forming a plurality of through-substrate vias comprising conductive material extending through a substrate; means for forming a plurality of terminals over a first side of the substrate, wherein individual ones of the vias electrically couple to individual ones of the terminals; means for forming a photoresist layer over the terminals; means for forming a plurality of openings within the photoresist layer, wherein individual ones of the openings are over corresponding ones of the terminals, and wherein the openings extend from the substrate in substantially the same direction, non-normal from a plane of the substrate; and means for depositing conductive material within the openings to form a corresponding plurality of tester interconnect structures.

Example 22

The apparatus of example 21 or any other example, wherein the photoresist layer is a first photoresist layer, wherein the openings are first openings, wherein the conductive material deposited within the first openings is a first conductive material, and wherein the apparatus further comprises: means for forming a second photoresist layer over the first photoresist layer; means for forming a second plurality of openings within the second photoresist layer, wherein individual ones of the second openings are on corresponding ones of the tester interconnect structures; and means for depositing a second conductive material within the second openings to correspondingly extend the tester interconnect structures.

Example 23

The apparatus of example 22 or any other example, wherein a first end of a first of the second openings is formed on a first tester interconnect structure, and the first opening is at an angle with respect to the first tester interconnect structure, the angle being less than 180 degrees.

Example 24

The apparatus of example 22 or any other example, wherein the means for depositing the second conductive material forms a plurality of contact tips on the plurality of tester interconnect structures.

Example 25

The apparatus of example 22 or any other example, wherein: the plurality of tester interconnect structures comprises a first tester interconnect structure; and the first tester interconnect structure includes: a first segment comprising the first conductive material, and a second segment comprising the second conductive material.

Example 26

The apparatus of example 21 or any other example, wherein the photoresist layer is a first photoresist layer, wherein the openings are first openings, wherein the conductive material is a first conductive material, and wherein the apparatus further comprises: means for forming a second photoresist layer over the first plurality of terminals, such that the second photoresist layer is interleaved between the first plurality of terminals and the first photoresist layer; means for forming a second plurality of openings within the second photoresist layer, prior to depositing the conductive material within the first openings and subsequent to forming the first openings, wherein individual ones of the second openings are aligned with corresponding ones of the first openings, and wherein the means for depositing the conductive material within the first openings comprises: means for depositing the conductive material within the first and second openings to form the tester interconnect structures.

Example 27

The apparatus of any of examples 21-26 or any other example, further comprising: means for removing the photoresist layer to expose the plurality of tester interconnect structures.

Example 28

The apparatus of any of examples 21-26 or any other example, further comprising: means for forming a space transformer, the space transformer electrically coupling individual ones of the tester interconnect structures to a test card comprising circuitry to test an Integrated Circuit (IC) device.

Example 29

An apparatus comprising: means for forming a plurality of through-substrate vias comprising conductive material extending through a substrate; means for forming a plurality of terminals on the substrate, individual ones of the terminals coupled to corresponding ones of the vias; means for depositing a layer of conductive material over the substrate, the layer of conductive material at least in part encapsulating the plurality of terminals; and means for selectively removing a portion of the conductive material to form a plurality of tester interconnect structures on the corresponding plurality of terminals.

Example 30

The apparatus of example 29 or any other example, wherein the means for selectively removing the portion of conductive material comprises: means for etching the conductive material anisotropically in a direction non-normal to a plane of the substrate.

Example 31

An apparatus comprising: means for performing the method of any of the examples 11-25 or any other example.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An electrical-test apparatus, comprising a MEMS array, wherein the MEMS array further comprises:
    a plurality of tester interconnect structures comprising electrically conductive material cantilevered from first terminals on a first side of a substrate; and
    a plurality of through-substrate vias that extend through the substrate, the vias comprising electrically conductive material, and wherein individual ones of the vias electrically couple individual ones of the tester interconnect structures to corresponding ones of second terminals on a second side of the substrate.

2. The apparatus of claim 1, wherein the tester interconnect structures have a first pitch, and wherein the apparatus further comprises a space transformer including a plurality of traces, wherein the traces connect the second terminals to third terminals, the second terminals have a second pitch, greater than the first pitch, and the third terminals have a third pitch, greater than the second pitch.

3. The apparatus of claim 1, wherein:
    the substrate comprises a crystal comprising silicon;
    the first terminals have a first cross-sectional length that is at least as large as a second cross-sectional length of the tester interconnect structures; and
    the second cross-sectional length is no more than 30 microns.

4. The apparatus of claim 1, wherein the MEMS array further comprises one or more interconnect levels, and the interconnect levels electrically couple the first terminals to the vias, or the interconnect levels electrically couple the vias to the second terminals.

5. The apparatus of claim 1, wherein the MEMS array comprises at least 5,000 of the tester interconnect structures, and wherein individual ones of the tester interconnect structures protrude by at least 100 μm from a corresponding anchor point on the substrate.

6. The apparatus of claim 5, wherein the tester interconnect structures extend from the substrate in substantially the same direction from a plane of the substrate.

7. The apparatus of claim 5, wherein individual ones of the tester interconnect structures have a bend between a free end of the tester interconnect structure and the anchor point.

8. An electrical-test system comprising:
    a memory to store instructions;
    a processor to execute the instructions to test Integrated Circuit (IC) devices; and
    a MEMS array, wherein the MEMS array further comprises:
        a plurality of tester interconnect structures comprising electrically conductive material cantilevered from first terminals on a first side of a substrate, wherein the tester interconnect structures have a first diameter, and
        a plurality of through-substrate vias that extend through the substrate, the vias comprising electrically conductive material and having a second diameter, larger than the first diameter, and wherein individual ones of the vias electrically couple individual ones of the tester interconnect structures to corresponding ones of second terminals on a second side of the substrate,
    wherein the tester interconnect structures are electrically coupled to the processor through the first terminals, the plurality of vias, and the second terminals, and
    wherein the processor is to test an IC device through contact between the tester interconnect structures and a corresponding plurality of interconnect structures of the IC device.

9. The system of claim 8, wherein the tester interconnect structures extend from the substrate in substantially the same direction, non-normal from a plane of the substrate.

10. The system of claim 8, wherein individual ones of the tester interconnect structures have a bend between a free end of the tester interconnect structure and an attached end anchored to the substrate.

11. A method comprising:
    forming a plurality of through-substrate vias comprising conductive material extending through a substrate;
    forming a plurality of terminals over a first side of the substrate, wherein individual ones of the vias electrically couple to individual ones of the terminals;
    forming a photoresist layer over the terminals;
    forming a plurality of openings within the photoresist layer, wherein individual ones of the openings are over corresponding ones of the terminals, and wherein the openings extend from the substrate in substantially the same direction, non-normal from a plane of the substrate; and
    depositing conductive material within the openings to form a corresponding plurality of tester interconnect structures.

12. The method of claim 11, wherein the photoresist layer is a first photoresist layer, wherein the openings are first openings, wherein the conductive material deposited within the first openings is a first conductive material, and wherein the method further comprises:
    forming a second photoresist layer over the first photoresist layer;
    forming a second plurality of openings within the second photoresist layer, wherein individual ones of the second openings are on corresponding ones of the tester interconnect structures; and
    depositing a second conductive material within the second openings to correspondingly extend the tester interconnect structures.

13. The method of claim 12, wherein a first end of a first of the second openings is formed on a first tester interconnect structure, and the first opening is at an angle with respect to the first tester interconnect structure, the angle being less than 180 degrees.

14. The method of claim 12, wherein depositing the second conductive material forms a plurality of contact tips on the plurality of tester interconnect structures.

15. The method of claim 12, wherein:
    the plurality of tester interconnect structures comprises a first tester interconnect structure; and
    the first tester interconnect structure includes: a first segment comprising the first conductive material, and a second segment comprising the second conductive material.

16. The method of claim 11, wherein the photoresist layer is a first photoresist layer, wherein the openings are first openings, wherein the conductive material is a first conductive material, and wherein the method further comprises:
    forming a second photoresist layer over the first plurality of terminals, such that the second photoresist layer is interleaved between the first plurality of terminals and the first photoresist layer;
    forming a second plurality of openings within the second photoresist layer, prior to depositing the conductive material within the first openings and subsequent to forming the first openings, wherein individual ones of the second openings are aligned with corresponding ones of the first openings, and
    wherein depositing the conductive material within the first openings comprises:
        depositing the conductive material within the first and second openings to form the tester interconnect structures.

17. The method of claim 11, further comprising:
    removing the photoresist layer to expose the plurality of tester interconnect structures.

18. The method of claim 11, further comprising:
    forming a space transformer, the space transformer electrically coupling individual ones of the tester interconnect structures to a test card comprising circuitry to test an Integrated Circuit (IC) device.

19. A method comprising:
    forming a plurality of through-substrate vias comprising conductive material extending through a substrate;
    forming a plurality of terminals on the substrate, individual ones of the terminals coupled to corresponding ones of the vias;
    depositing a layer of conductive material over the substrate, the layer of conductive material at least in part encapsulating the plurality of terminals; and
    selectively removing a portion of the conductive material to form a plurality of tester interconnect structures on the corresponding plurality of terminals.

20. The method of claim 19, wherein selectively removing the portion of conductive material comprises:
    etching the conductive material anisotropically in a direction non-normal to a plane of the substrate.

* * * * *